(12) United States Patent
Nie et al.

(10) Patent No.: US 11,923,312 B2
(45) Date of Patent: Mar. 5, 2024

(54) PATTERNABLE DIE ATTACH MATERIALS AND PROCESSES FOR PATTERNING

(71) Applicant: Intel Corporation, Santa Clara, CA (US)

(72) Inventors: Bai Nie, Chandler, AZ (US); Gang Duan, Chandler, AZ (US); Srinivas Pietambaram, Chandler, AZ (US); Jesse Jones, Chandler, AZ (US); Yosuke Kanaoka, Chandler, AZ (US); Hongxia Feng, Chandler, AZ (US); Dingying Xu, Chandler, AZ (US); Rahul Manepalli, Chandler, AZ (US); Sameer Paital, Chandler, AZ (US); Kristof Darmawikarta, Chandler, AZ (US); Yonggang Li, Chandler, AZ (US); Meizi Jiao, Chandler, AZ (US); Chong Zhang, Chandler, AZ (US); Matthew Tingey, Hillsboro, OR (US); Jung Kyu Han, Chandler, AZ (US); Haobo Chen, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 1119 days.

(21) Appl. No.: 16/366,661

(22) Filed: Mar. 27, 2019

(65) Prior Publication Data

US 2020/0312771 A1 Oct. 1, 2020

(51) Int. Cl.
*H01L 23/538* (2006.01)
*H01L 23/00* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 23/5389; H01L 21/4853; H01L 21/4857; H01L 21/565; H01L 21/78; H01L 23/3121; H01L 23/5381; H01L 23/5383; H01L 23/5386; H01L 23/562; H01L 24/19; H01L 24/20; H01L 2224/214; H01L 2924/3511; H01L 2924/381; H01L 23/5385; H01L 21/56; H01L 21/563; H01L 24/16; H01L 2224/1403; H01L 2224/16225; H01L 2224/16235; H01L 2924/00014; H01L 2924/15192; H01L 23/49811; H01L 21/486; H01L 21/76895;
(Continued)

(56) References Cited

U.S. PATENT DOCUMENTS

2006/0273455 A1* 12/2006 Williams ................ H01L 25/18
257/723
2010/0213603 A1* 8/2010 Smeys ................ H01L 23/3114
257/713
(Continued)

*Primary Examiner* — Mohammad A Rahman
(74) *Attorney, Agent, or Firm* — Schwabe, Williamson & Wyatt, P.C.

(57) ABSTRACT

A die assembly is disclosed. The die assembly includes a die, one or more die pads on a first surface of the die and a die attach film on the die where the die attach film includes one or more openings that expose the one or more die pads and that extend to one or more edges of the die.

12 Claims, 20 Drawing Sheets

(51) Int. Cl.
*H01L 21/48* (2006.01)
*H01L 21/56* (2006.01)
*H01L 21/78* (2006.01)
*H01L 23/31* (2006.01)

(52) U.S. Cl.
CPC ............ *H01L 21/565* (2013.01); *H01L 21/78* (2013.01); *H01L 23/3121* (2013.01); *H01L 23/5381* (2013.01); *H01L 23/5383* (2013.01); *H01L 23/5386* (2013.01); *H01L 23/562* (2013.01); *H01L 24/19* (2013.01); *H01L 24/20* (2013.01); *H01L 2224/214* (2013.01); *H01L 2924/3511* (2013.01); *H01L 2924/381* (2013.01)

(58) Field of Classification Search
CPC ......... H01L 21/76898; H01L 23/49816; H01L 23/49827; H01L 23/49838; H01L 23/5384; H01L 2224/26–33519; H01L 2224/8385–83885
See application file for complete search history.

(56) References Cited

U.S. PATENT DOCUMENTS

| | | | | |
|---|---|---|---|---|
| 2012/0161316 A1* | 6/2012 | Gonzalez | ................ | H01L 24/06 |
| | | | | 257/737 |
| 2013/0271174 A1* | 10/2013 | Johnson | .................. | H01L 22/14 |
| | | | | 324/756.01 |
| 2016/0093548 A1* | 3/2016 | Cook | .................. | H01L 23/3121 |
| | | | | 438/48 |
| 2016/0233179 A1* | 8/2016 | Huang | .................... | H01L 24/48 |

* cited by examiner

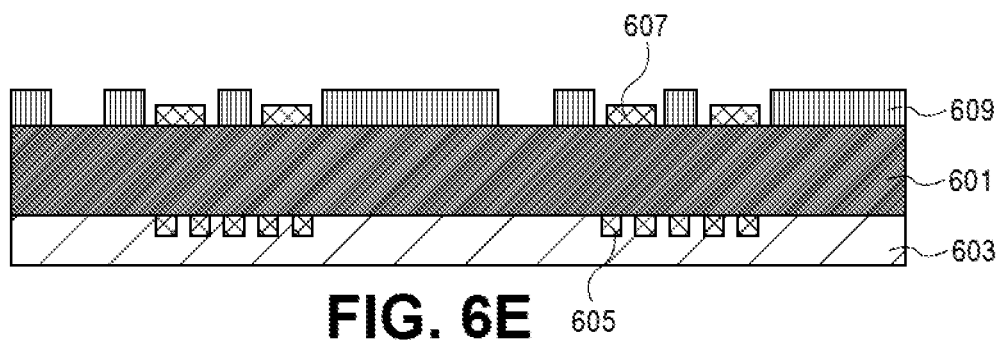
FIG. 6E
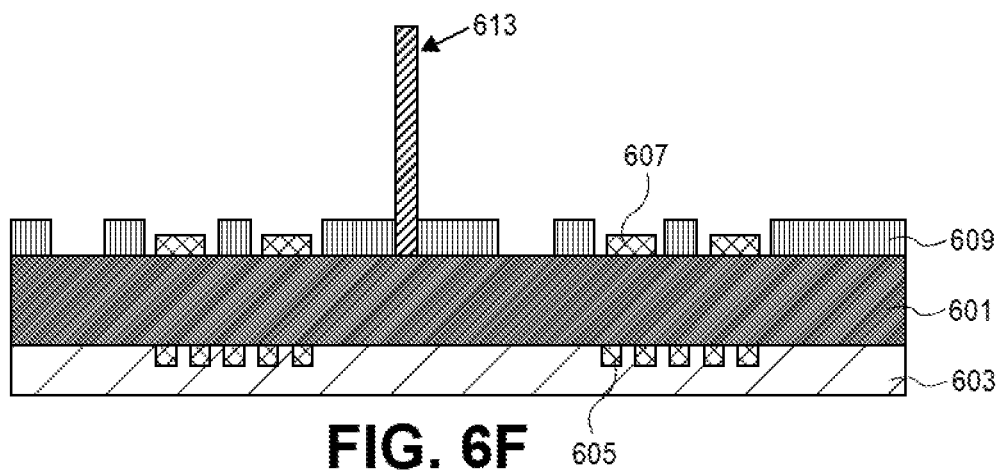
FIG. 6F
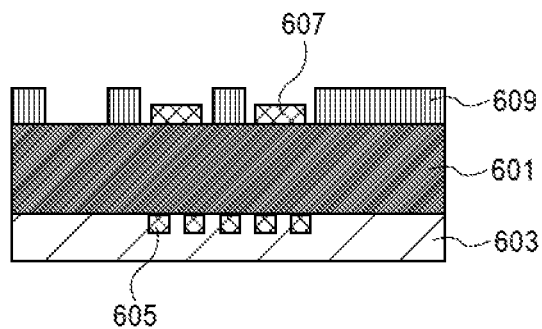 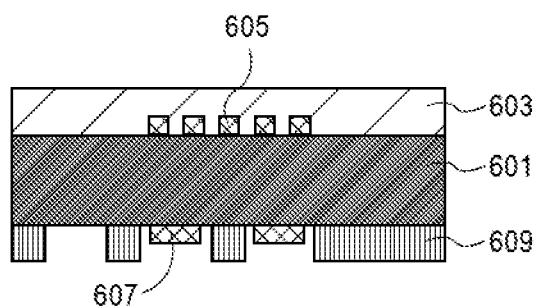
FIG. 6G                FIG. 6H

PATTERNABLE DIE ATTACH MATERIALS AND PROCESSES FOR PATTERNING

TECHNICAL FIELD

Embodiments of the disclosure pertain to die attach films (DAFs) and, in particular, to patternable die attach films and processes for patterning such.

BACKGROUND

Embedded Multi-die Interconnect Bridge (EMIB) technology includes semiconductor bridges that have ultrafine line-space structures for die-to-die (D2D) interconnect communications. EMIB technology is useful in heterogeneous chip integration applications. EMIB packaging technology is an advanced, cost-effective approach to, in-package, high density, interconnecting of heterogeneous chips. It provides extremely high I/O and well controlled electrical interconnect paths between multiple dies.

Die attach film material is used to attach dies such as EMIB dies to a package structure. For practical purposes, die attach film (DAF) materials are designed to absorb the mechanical stress induced by the coefficient of thermal expansion (CTE) mismatch between a semiconductor die that is formed on the DAF material and the organic substrate that is located below the DAF material. It protects the package from warpage and reliability failures. In packaging architectures that involve vertical D2D connections and through silicon via (TSV) die embedding, dies need to be tested before embedding for significant cost savings, and only known good dies (KGDs) are allowed to continue in the process flow to the end of line for production.

However, conventional DAF material is not patternable and has to be removed by wet chemistry, or dry etch, in order to expose back side copper pads that enable vertical connections for downstream process steps. Accordingly, die architectures that use such DAFs are not suitable for vertical D2D and embedded die TSV approaches.

BRIEF DESCRIPTION OF THE DRAWINGS

FIGS. 6A-6K illustrate cross-sections of a die assembly and a package substrate during a process of forming a package structure that includes a laser drilled patterned DAF according to an embodiment.

DESCRIPTION OF THE EMBODIMENTS

Figure 1A:
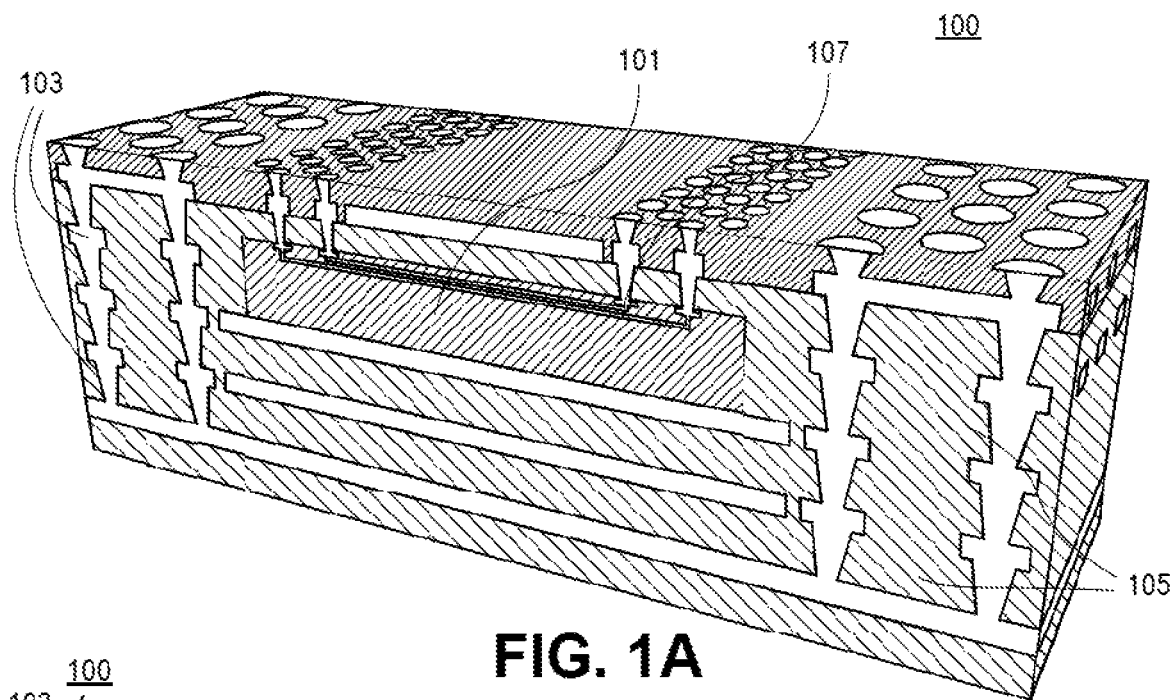
FIG. 1A illustrates a semiconductor package substrate that has an Embedded Multi-die Interconnect Bridge (EMIB) architecture and includes an EMIB device.

A patternable die attach film (DAF) is described. It should be appreciated that although embodiments are described herein with reference to example patternable die attach film implementations, the disclosure is more generally applicable to patternable die attach film implementations as well as other type patternable die attach film implementations. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

The tiling and/or partitioning of package components is increasingly being used in the semiconductor packaging industry because it enables heterogeneous die integration, miniaturization of form factor, and high performance with improved yield (smaller package components and circuits can be produced with higher yield).

In emerging architectures, in order to increase communication bandwidth and reduce the semiconductor area of logic chips, a scaling down of Embedded Multi-die Interconnect Bridge (EMIB) die bump pitch (hence the line-space structures), that can support cutting edge packaging architectures for die tiling and heterogeneous integration applications is needed. In addition to the requirement of better die bonding accuracy and tighter registration tolerances, the scaling of EMIB technology requires: (1) creating void-free and mechanically reliable interfaces between die back side and cavity material surfaces, (2) controlling die area warpage post die bonding and post dielectric material encapsulation, and (3) generating die back side openings to enable through silicon via D2D vertical connections for 3D packaging applications.

Current die bonding processes rely on the bonding of dies to cavity interface material through flush die attach films (DAFs). In packaging architectures that involve vertical D2D connections and TSV die embedding, dies need to be tested before embedding for significant cost savings, and only known good dies (KGDs) are allowed to continue in the process flow to the end of line for production. However, DAF material may not be patternable and has to be removed by wet chemistry or dry etch in order to expose back side copper pads for purposes of enabling vertical connections for downstream process steps. Accordingly, die architectures that use flush non-patternable DAFs are not suitable for vertical D2D and embedded die TSV approaches.

An approach that addresses the shortcomings of previous approaches is disclosed herein. For example, as part of a disclosed process, DAF can be patterned on die surfaces for emerging heterogeneous integration applications that require die embedding, patching, tiling, etc. Several approaches for patterning the DAF material are described. In an embodiment, using any of these approaches, TSV die back side pads can be exposed for easy access that enable electrical tests for binning. In addition, manufacturing process flow can be significantly simplified to reduce wet chemistry exposure risks such that product reliability is improved.

In an embodiment, a low cost, readily implementable and high yield approach is provided that overcomes the shortcomings of previous approaches. In an embodiment, the described examples can be used to provide high density die-die interconnections. In an embodiment, EMIB and other heterogeneous integration approaches to interconnecting modular die can be more fully utilized by virtue of exposed back side copper pads that enable vertical connections for downstream process steps. Accordingly, DAFs that facilitate electrical testing and that are suitable for embedded die TSV approaches are provided.

Figure 1B:
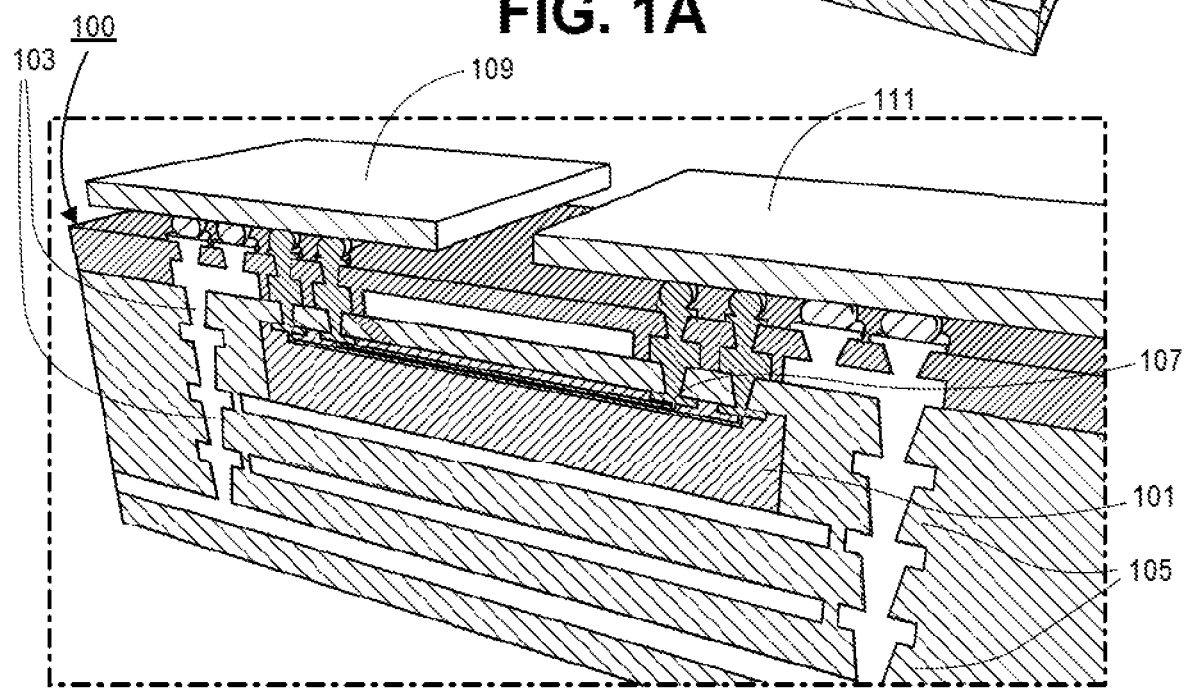
FIG. 1B illustrates the manner in which an EMIB device is used to communicatively couple or connect a first die and a second die.

FIG. 1A illustrates a package substrate 100 that has an EMIB architecture and includes an embedded EMIB device. In FIG. 1A, the package substrate 100 includes embedded EMIB device 101, metal layers 103, dielectric layers 105 and pads 107. FIG. 1B illustrates the manner in which the EMIB device 101 is used to communicatively couple or connect first die 109 and second die 111. Referring to FIG. 1B, the embedded EMIB device 101 is connected to the first die 109 and the second die 111 through metal interconnects that extend upward from top surface contacts of embedded EMIB device 101 through vias in the package substrate 100. The first die 109 and the second die 111 are attached at the top surface of the package substrate 100.

Figure 1C:
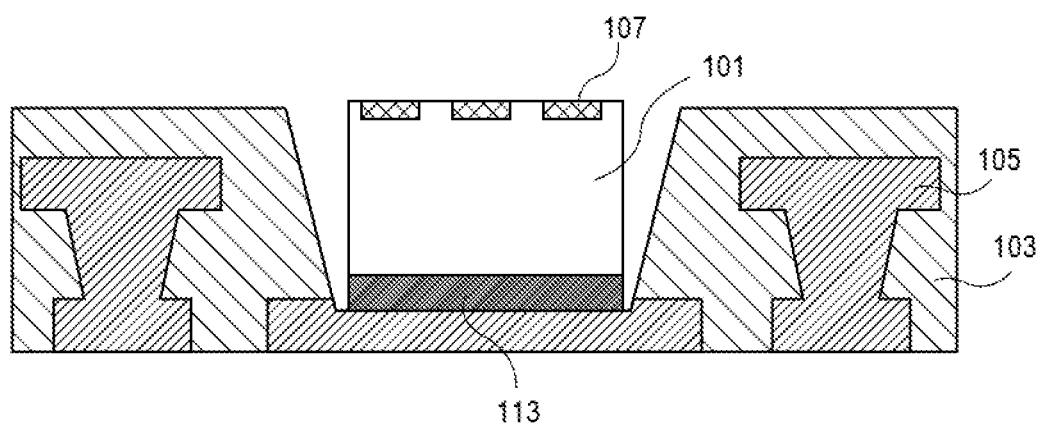
FIG. 1C illustrates the use of a die attach film (DAF) to attach an EMIB device to a package substrate.

FIG. 1C illustrates the use of a die attach film to attach an EMIB device. Referring to FIG. 1C, the EMIB device 101 is mounted to the package substrate 100 by die attach film (DAF) 113. It should be appreciated that the EMIB device 101 does not include back side pads that are needed to support cutting edge packaging architectures for die tiling and heterogeneous integration applications that can involve connection to die below the EMIB device 101. Moreover, for such cutting edge packaging architectures for die tiling and heterogeneous integration applications that may utilize connection to die below the EMIB device 101, a non-patternable die attach film such as DAF 113 shown in FIG. 1C can be problematic.

Embedded die are required in many substrate and interposer processes. Die mount technology is key to enabling maximal function and ensuring reliability of a substrate or interposer. Example die mount architectures (bridge die and TSV die) are illustrated below in FIGS. 2 and 3.

Figure 2:
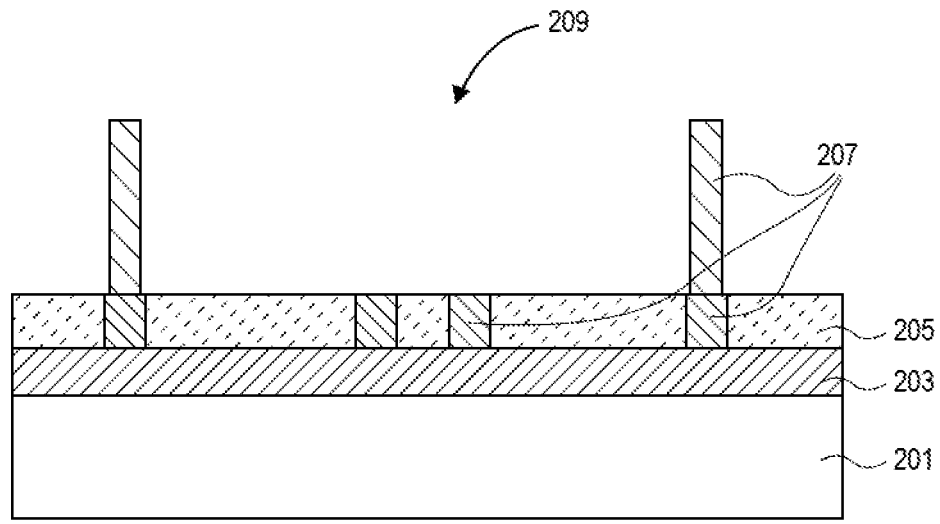
FIG. 2 illustrates the structure of a package substrate with a cavity that can be used to mount a through silicon via (TSV) die according to an embodiment.

FIG. 2 illustrates the structure of a package substrate with a cavity that can be used to mount a TSV die according to an embodiment. Referring to FIG. 2, the package substrate includes substrate 201, metal layer 203, dielectric layer 205 and interconnects 207. The package substrate includes a cavity 209 on the top portion of the package substrate. In an embodiment, a TSV die can be mounted in the cavity 209 and can be configured to enable electrical connection to the TSV die from above and below the TSV die.

Figure 3:
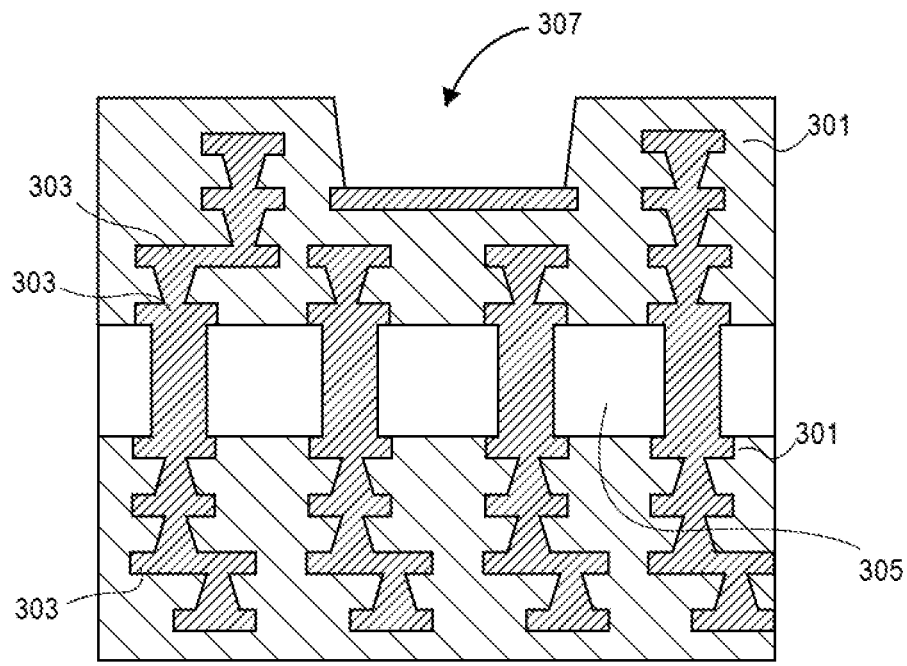
FIG. 3 illustrates the structure of a package substrate with a cavity that can be used to mount an EMIB bridge die according to an embodiment.

FIG. 3 illustrates the structure of an EMIB package substrate with a cavity that can be used to mount an EMIB device according to an embodiment. Referring to FIG. 3, the package substrate includes a plurality of dielectric layers 301, a plurality of wiring layers 303, a package core 305 and a cavity 307. The cavity 307 is formed in the top portion of the package substrate and extends into the package substrate from the surface of the package substrate. In an embodiment, an EMIB die can be mounted in the cavity 307 and can be configured to enable electrical connection to the EMIB die from above the EMIB die.

Figure 4A:
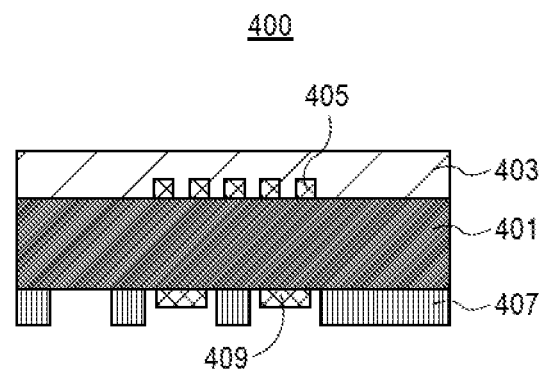
FIG. 4A illustrates a cross-section of a die assembly that includes a patterned DAF layer according to an embodiment.
Figure 4B:
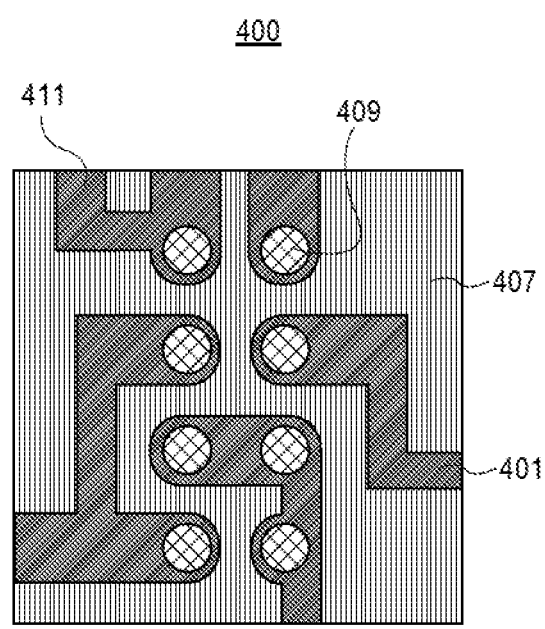
FIG. 4B illustrates a bottom view of the die assembly shown in FIG. 4A according to an embodiment.

FIG. 4A illustrates a cross-section of a die assembly 400 that includes a patterned DAF layer and FIG. 4B shows a bottom view of the die assembly 400 according to an embodiment. Referring to FIGS. 4A and 4B, the die assembly 400 includes die 401, dielectric material 403, top pads 405, DAF 407, bottom pads 409 and DAF channels 411.

In FIG. 4B, a die bottom view is shown that depicts an example patterning of the DAF channels 411 that are formed in the DAF 407. The under filling of the DAF channels 411 are enabled by openings of the DAF channels 411 in non-pad regions (such as non-Cu pad regions). In an embodiment, these openings extend to the edge of the die assembly 400. In an embodiment, the openings can be used to fill the DAF channels 411 with epoxy or mold after die mount.

FIGS. 5A-5L illustrate cross-sections of a die and a package substrate during a process of forming a package structure according to an embodiment. In particular, FIGS. 5A-5L are cross-sections of the package structure 500 during a process that includes lithographically patterning a DAF that is formed on the die according to an embodiment.

Figure 5A:
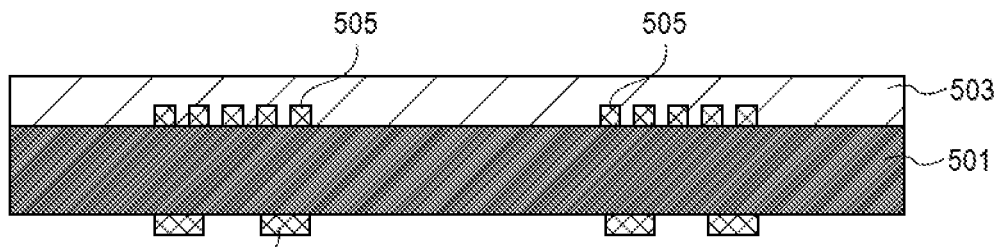
FIGS. 5A-5L illustrate cross-sections of a die assembly and a package substrate during a process of forming a package structure that includes a lithographically patterned DAF according to an embodiment.

Referring to FIG. 5A, subsequent to one or more operations, a die assembly that includes die 501, dielectric lamination 503, die pads 505, and die pads 507 is formed. In an embodiment, the dielectric lamination 503 is formed on a first surface of the die 501 and covers die pads 505. In an embodiment, the die pads 507 are formed on a second surface of the die 501.

Figure 5B:
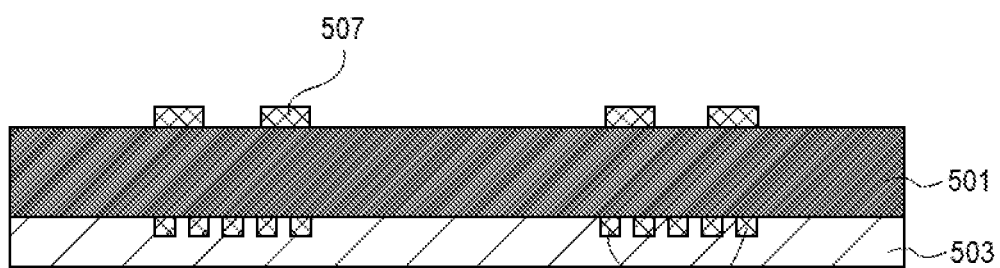

Referring to FIG. 5B, subsequent to one or more operations that result in the cross-section of the die assembly shown in FIG. 5A, (after dielectric encapsulation on SiB silicon interconnect bump side) the die assembly that includes die 501, dielectric lamination 503, die pads 505 and die pads 507 is flipped.

Figure 5C:
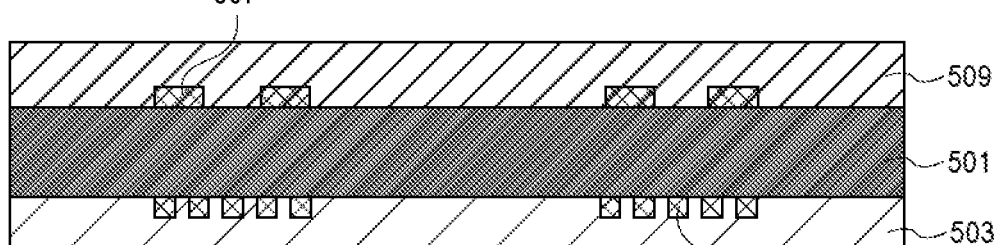

Referring to FIG. 5C, subsequent to one or more operations that result in the cross-section of the die assembly shown in FIG. 5B, (after dielectric encapsulation on the SiB side) photoresist 509 is formed on the die 501 and covers the die pads 507.

Figure 5D:
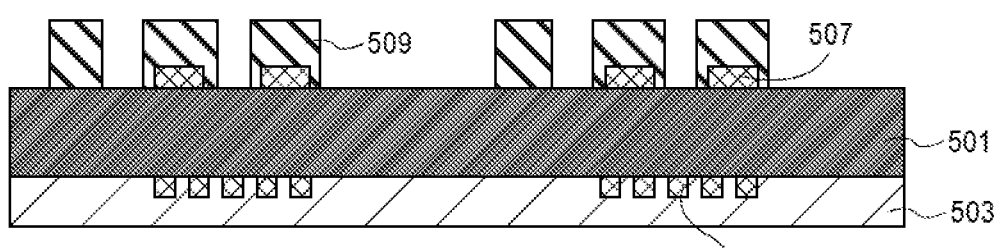

Referring to FIG. 5D, subsequent to one or more operations that result in the cross-section of the die assembly shown in FIG. 5C, the photoresist 509 is patterned and developed. In an embodiment, lithography exposure can be used to form a desired pattern.

Figure 5E:
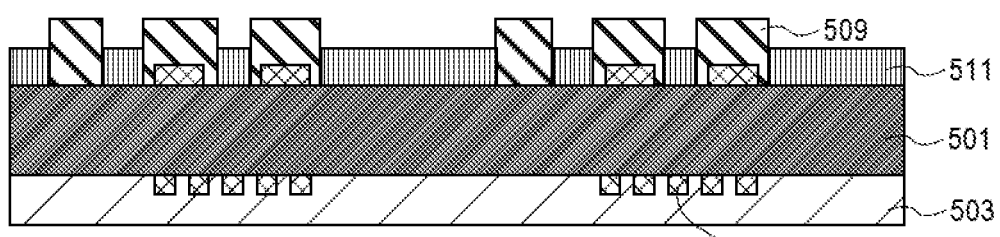

Referring to FIG. 5E, subsequent to one or more operations that result in the cross-section of the die assembly shown in FIG. 5D, the DAF 511 is formed on the die (e.g., the wafer is coated with the material that is used to form the DAF).

Figure 5F:
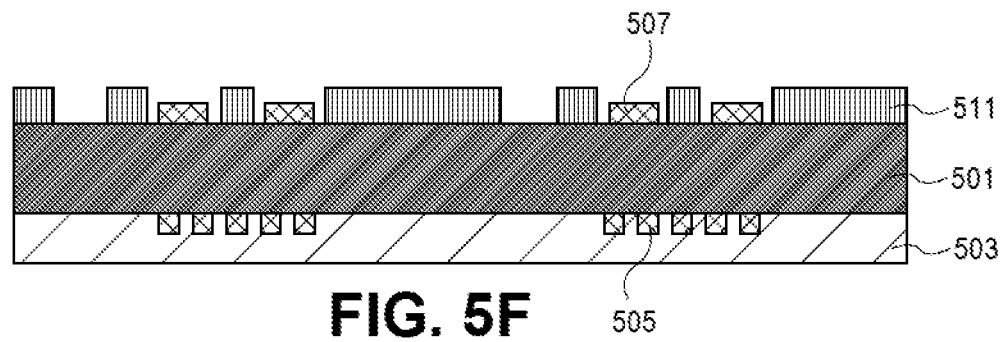

Referring to FIG. 5F, subsequent to one or more operations that result in the cross-section of the die assembly, the photoresist 509 is removed. In an embodiment, the photoresist is removed by stripping using either a wet or dry etching process. In other embodiments, the photoresist can be removed by other suitable manners of removing the photoresist.

Figure 5G:
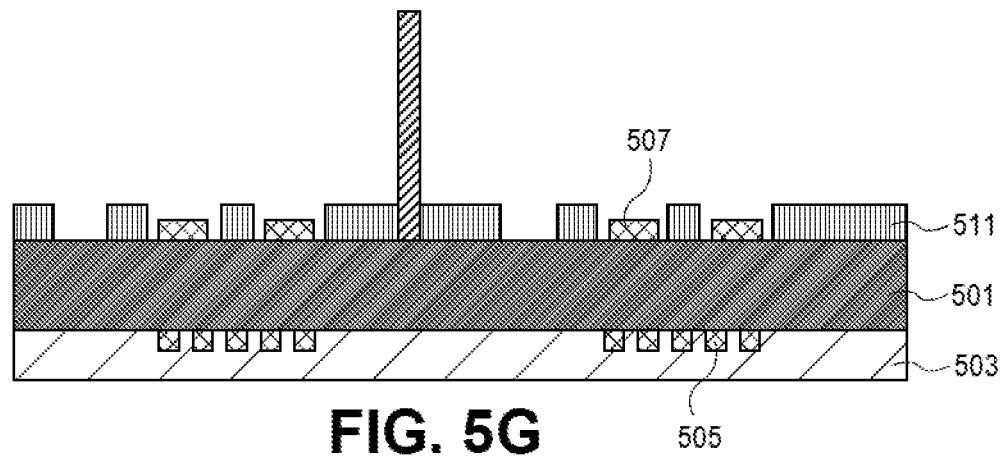
Figure 5H:
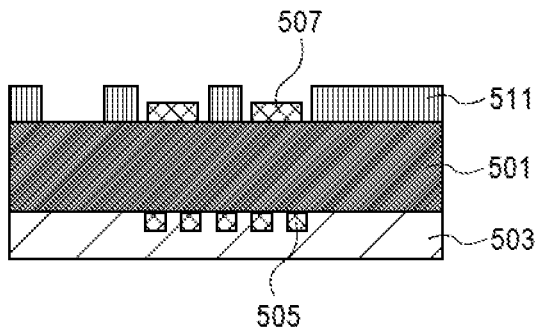
Figure 5I:
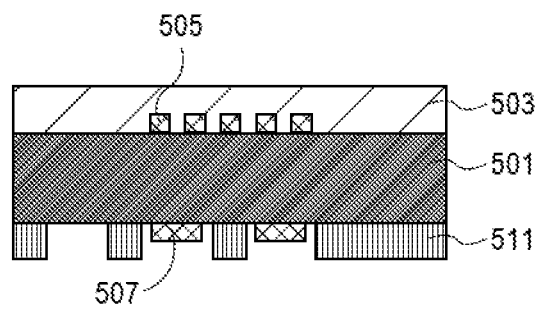

Referring to FIG. 5G, subsequent to one or more operations that result in the cross-section of the die assembly shown in FIG. 5F, the wafer is singulated into individual dies as shown in FIG. 5H, and tested. Referring to FIG. 5I, after one or more operations that result in the cross-section of the die assembly shown in FIG. 5G, the die assembly is flipped.

Figure 5J:
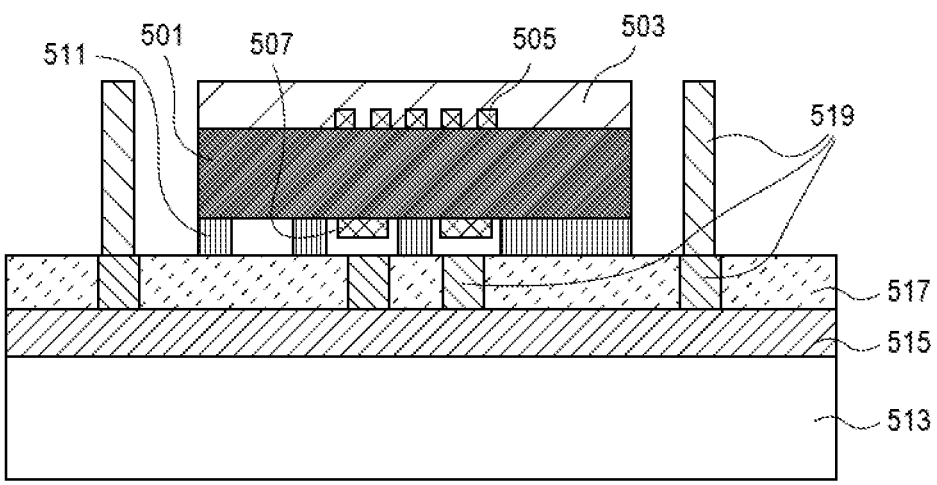

Referring to FIG. 5J, subsequent to one or more operations that result in the cross-section of the die assembly shown in FIG. 5H, the die assembly (if determined suitable by testing) is attached to a package substrate (the die assembly is mounted). In an embodiment, the package substrate includes substrate 513, metal layer 515, dielectric layer 517 and interconnects 519.

Figure 5K:
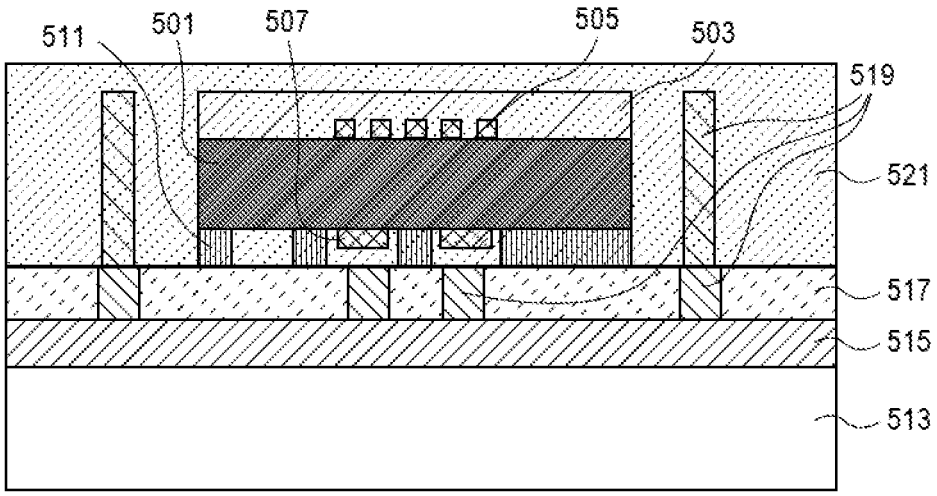
Figure 5L:
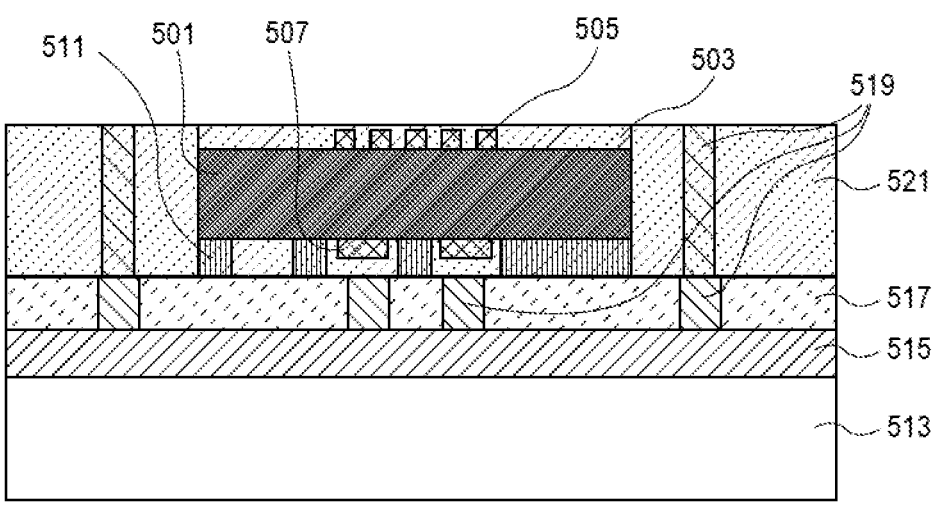

Referring to FIG. 5K, subsequent to one or more operations that result in the cross-section of the die assembly shown in FIG. 5J, an epoxy/mold 521 is used to encapsulate the top portion of the package structure including the die assembly and to under-fill the openings that are formed in the DAF 511. In other embodiments, other material can be used to encapsulate top portion of the package structure including the die assembly and to under-fill the openings. Referring to FIG. 5L, after one or more operations that result in the cross-section of the package structure shown in FIG. 5K, the package structure including the mold 521 is planarized.

In an embodiment, die attach formulations can be composed of resin, filler, hardener, catalyst, diluent, thixotropic agent. Photoresists can be composed of resin, filler, and sensitizer etc. Both formulations can share similar resin such as acrylate, polyimide, epoxy as well as filler such as silica. Thus, it is possible to use pattern-able polyimide, acrylate resin components in die attach formulations in order to provide patternable die attach capability.

In an embodiment, the DAF can include pattern-able components (resin, monomers, and sensitizer), epoxy/filler (mechanical properties), some other additives to control the thixotropic properties of the patternable die attach materials for die back side connection application. An example formulation includes acrylic oligomer (~10-30%) with COOH group which can be dissolved into alkaline solution during development to create the patterns needed, epoxy (20-50%) to give desired mechanical strength and adhesion, fillers of 10-30% ($SiO_2$ or others) and other additives (0-20%) to control the thixotropic properties of the film. In other embodiments, other formulations can be used. It should be appreciated that conventional dry film photoresists may not provide the desired mechanical strength. In addition, solder resist and photo-imageable resist may not meet thixotropic properties and modulus requirements.

FIGS. 6A-6K illustrate cross-sections of a die assembly and a package substrate during a process of forming a package structure according to an embodiment. In particular, FIGS. 6A-6K are cross-sections of the package structure during a process that includes laser drill patterning of a DAF that is formed on the die assembly according to an embodiment.

Figure 6A:
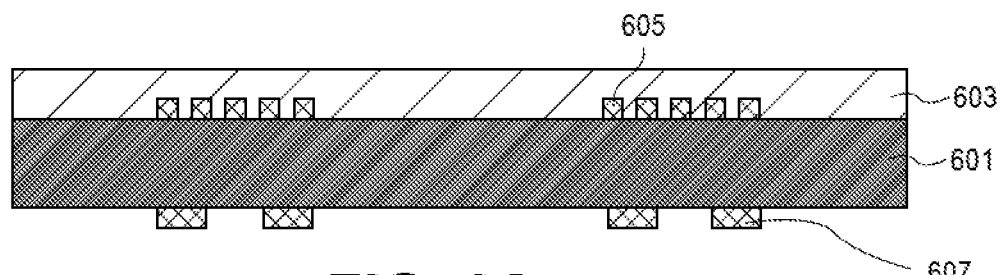

Referring to FIG. 6A, subsequent to one or more operations a die assembly that includes die substrate 601, dielectric lamination 603, die pads 605, and die pads 607 is formed. In an embodiment, the dielectric lamination 603 is formed on a first surface of the die 601 and covers the die pads 605.

Figure 6B:
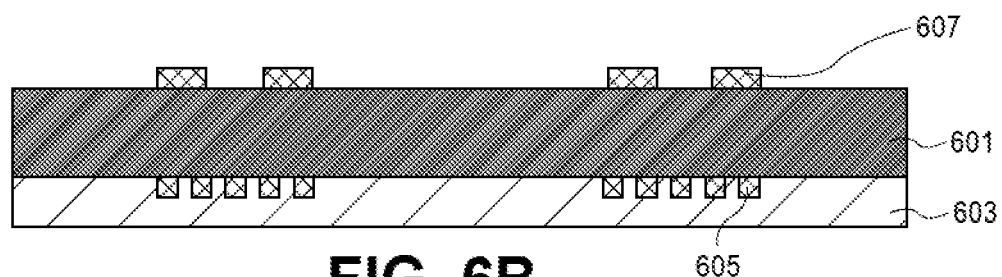
Figure 6C:
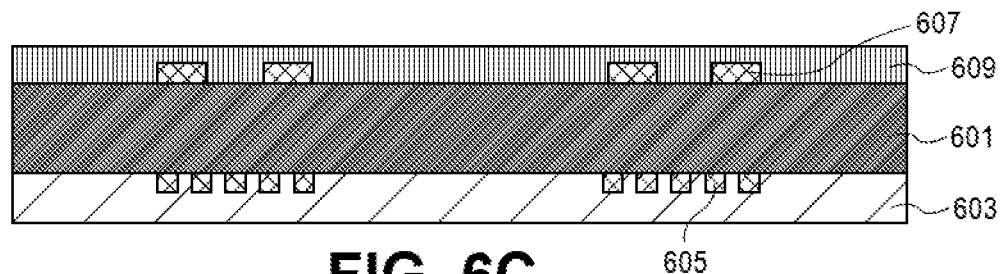

Referring to FIG. 6B, subsequent to one or more operations that result in the cross-section of die assembly shown in FIG. 6A, (after dielectric encapsulation of the die pads 605 on the SiB side of the die) the die assembly is flipped. Referring to FIG. 6C, after one or more operations that result in the cross-section of die assembly shown in FIG. 6B, a DAF 609 is formed on the die assembly.

Figure 6D:
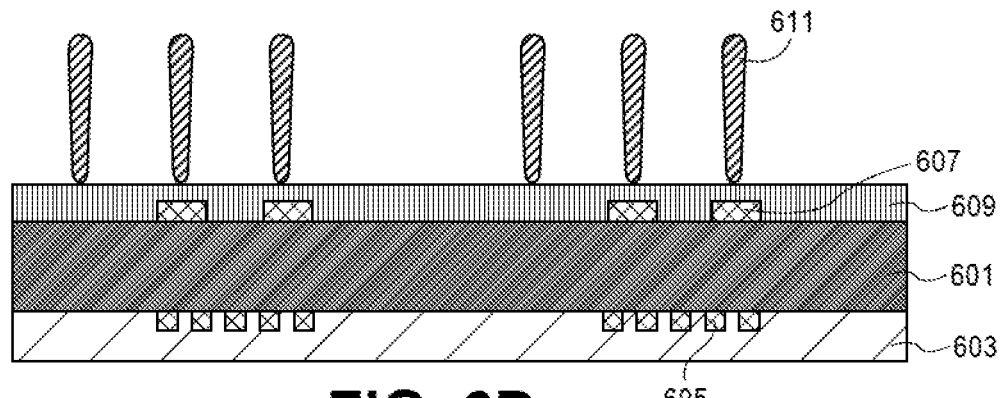

Referring to FIG. 6D, subsequent to one or more operations that result in the cross-section of die assembly shown in FIG. 6C, desired DAF patterns are formed by laser patterning 611 the DAF 609. The resultant structure is shown in FIG. 6E. Referring to FIG. 6F, after one or more operations that result in the cross-section of the die assembly shown in FIG. 6E, the die assembly wafer is singulated 613 into individual die assemblies as shown in FIG. 6G, and tested.

Figure 6I:
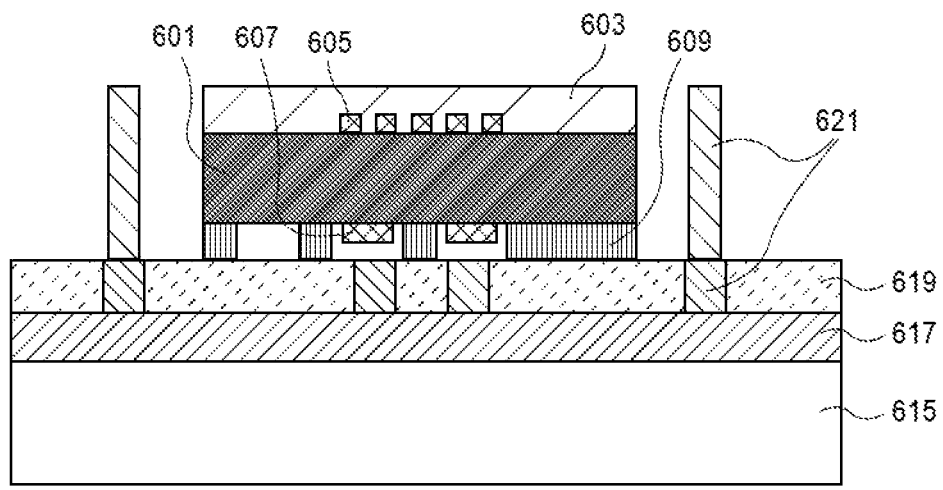

Referring to FIG. 6H, subsequent to one or more operations that result in the cross-section of the die assembly shown in FIG. 6G, the die assembly is flipped. Referring to FIG. 6I, after one or more operations that result in the cross-section of the die assembly shown in FIG. 6H, the die assembly (if determined to be suitably functioning) is attached to a package substrate assembly. In an embodiment, the package substrate assembly includes substrate 615, metal layer 617, dielectric layer 619 and interconnects 621.

Figure 6J:
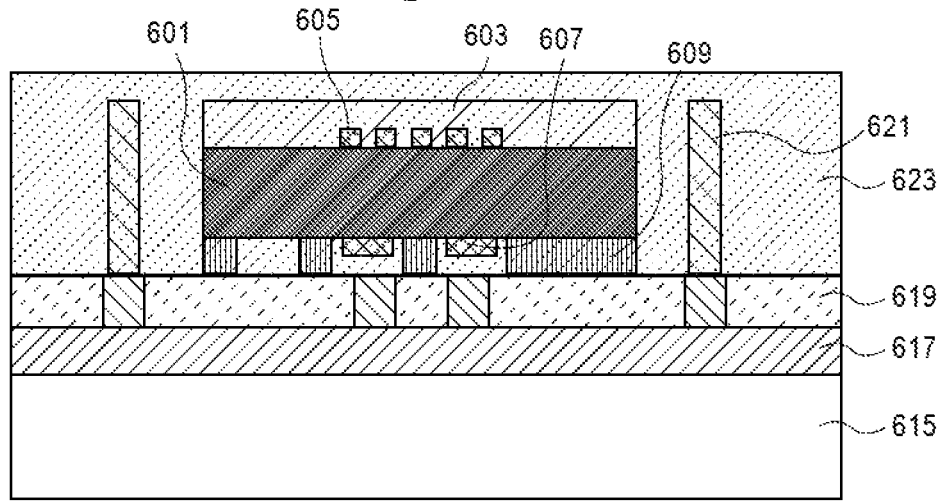
Figure 6K:
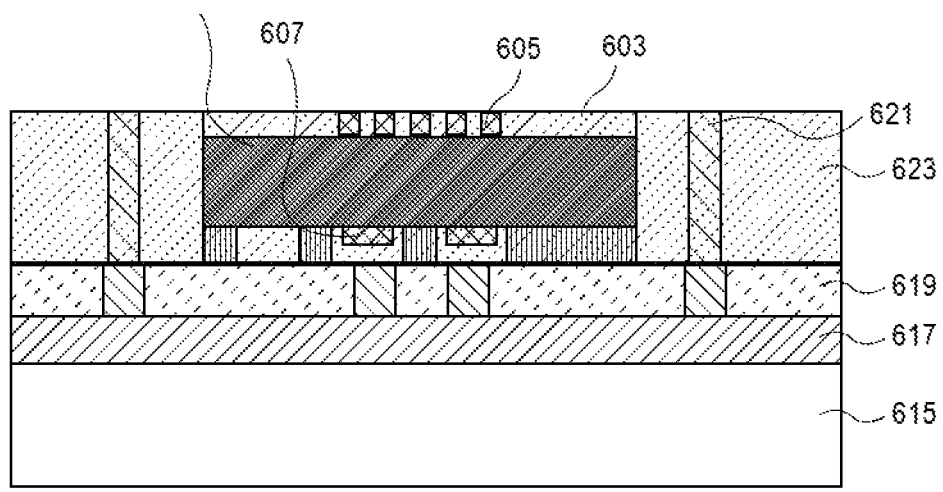

Referring to FIG. 6J, subsequent to one or more operations that result in the cross-section of the package structure shown in FIG. 6I (after mounting of the die assembly), epoxy/mold 623 is used to encapsulate the top of the package structure including the die assembly and to under-fill openings that are formed in the DAF 609. Referring to FIG. 6K, after one or more operations that result in the cross-section of the package structure shown in FIG. 6J, the package structure is planarized.

In an embodiment, in the laser drilled patterned DAF process described with reference to FIGS. 6A-6K, instead of using lithography patterning, a laser is used to drill directly into the DAF 609 in order to create a desired pattern. In an embodiment, this process is initiated at the wafer level. As part of the process, the PSB (package side bump) side is provided with a flush layer of DAF. A laser is then used to pattern the DAF by drilling openings in the DAF. In an embodiment, after these initial operations, the remaining process flow can be the same as the post patterning process flow of the lithographic patterned DAF process described with reference to FIGS. 5A-5L. In an embodiment, the DAF can be covered with poly(ethylene terephthalate) (PET) film and the laser employed to drill through the PET film in order to create the pattern. In an embodiment, a benefit of using PET film is to protect the DAF during testing and transportation. In an embodiment, the PET film can be removed (e.g., peeled off) immediately preceding die mount.

FIGS. 7A-7K illustrate cross-sections of a die and a package substrate during a process of forming a package structure according to an embodiment. In particular, FIGS. 7A-7K are cross-sections of the package structure during a process that includes mask etch patterning of a DAF that is formed on the die according to an embodiment.

Figure 7A:
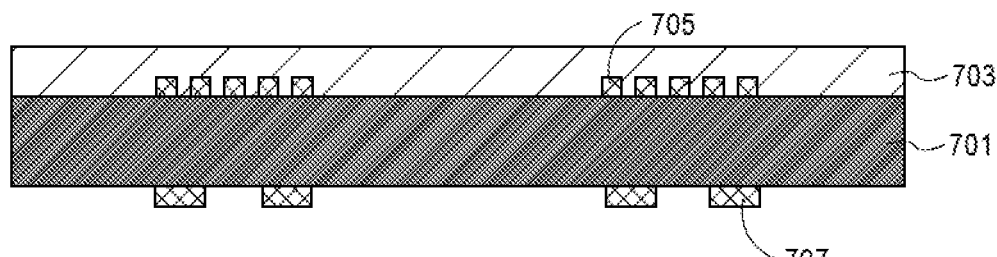
FIGS. 7A-7K illustrate cross-sections of a die assembly and a package substrate during a process of forming a package structure that includes a mask patterned DAF according to an embodiment.
Figure 7B:
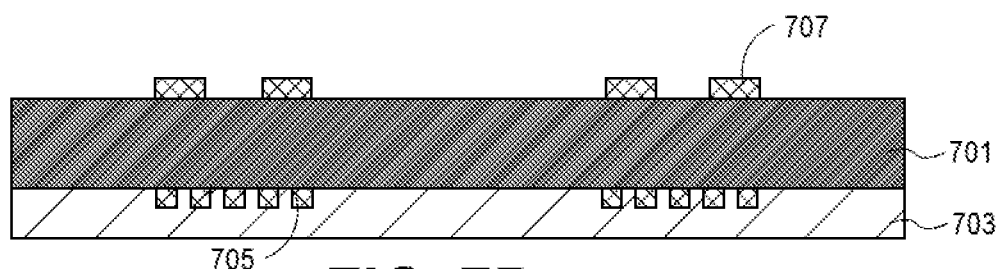

Referring to FIG. 7A, after a plurality of operations a die assembly that includes die 701, dielectric lamination 703, die pads 705 and die pads 707 is formed. In an embodiment, the dielectric lamination 703 is formed on the die 701. Referring to FIG. 7B, after one or more operations that result in the cross-section of the die assembly shown in FIG. 7A, (after dielectric encapsulation of the die pads 705 on SiB side of the die wafer) the die assembly is flipped.

Figure 7C:
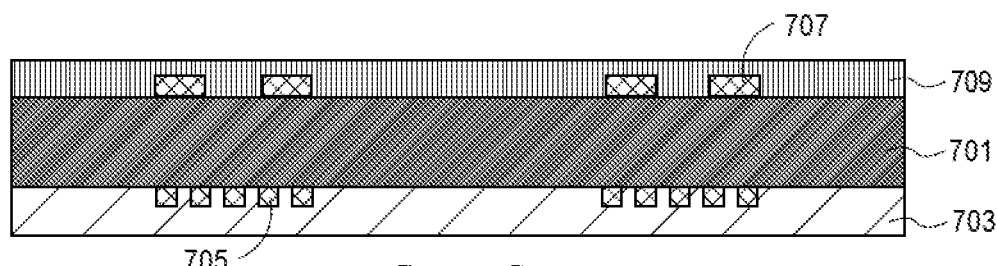
Figure 7D:
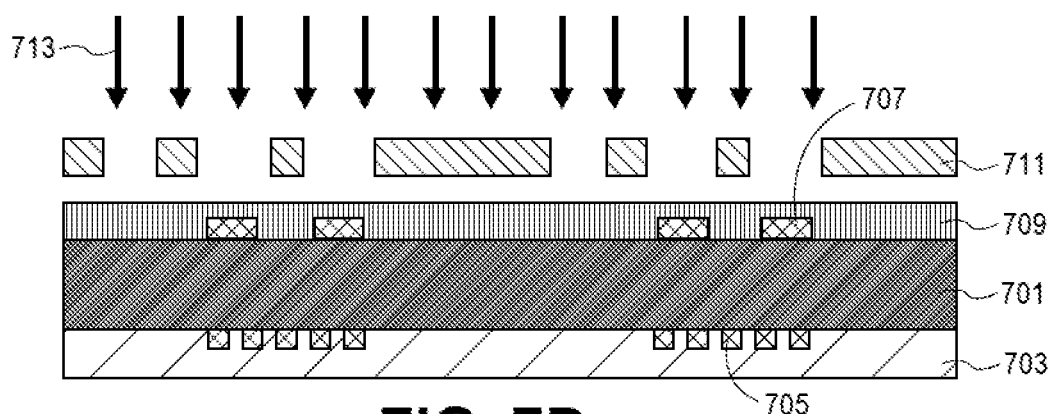

Referring to FIG. 7C, subsequent to one or more operations that result in the cross-section of die structure shown in FIG. 7B, a DAF layer 709 is formed on the die assembly. Referring to FIG. 7D, after one or more operations that result in the cross-section of die assembly shown in FIG. 7C, desired DAF patterns are formed by mask etching using the mask 711 to pattern the DAF using radiation 713. The resultant structure is shown in FIG. 7E.

Figure 7E:
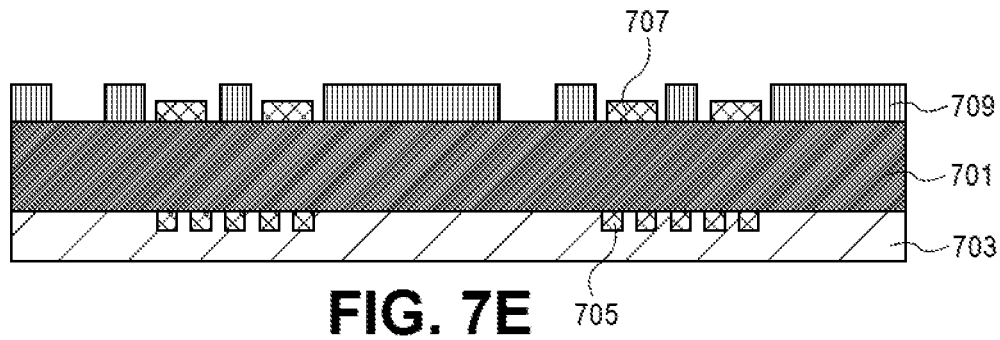
Figure 7F:
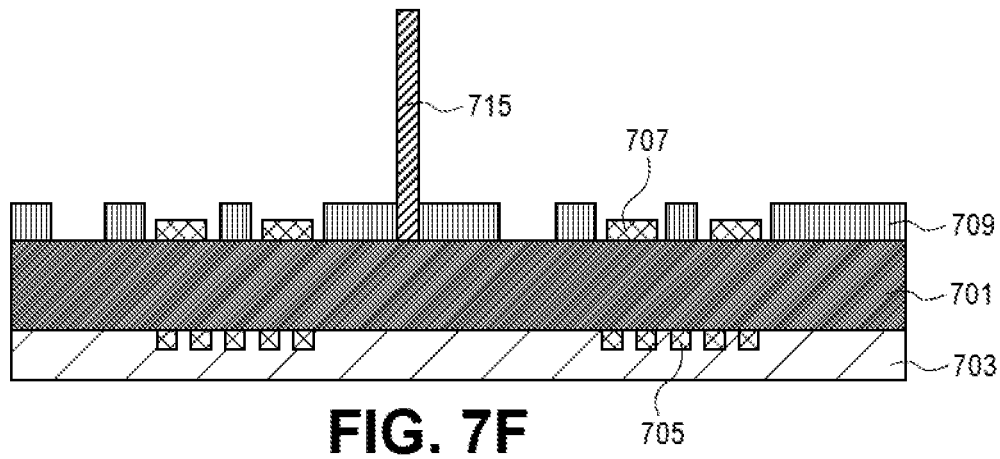
Figure 7G:
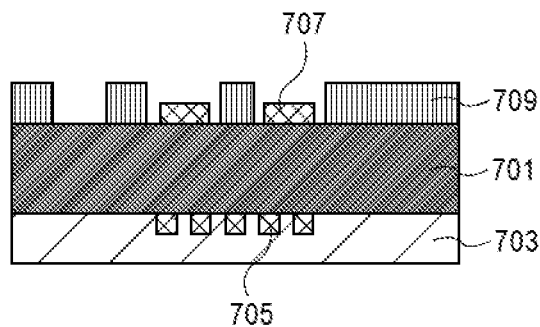
Figure 7H:
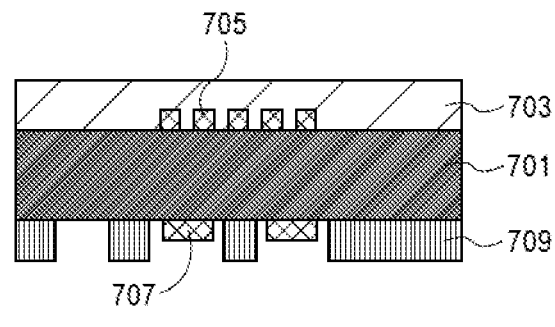

Referring to FIG. 7F, subsequent to one or more operations that result in the cross-section of the die assembly shown in FIG. 7E, the die assembly wafer is singulated into individual die assemblies as shown in FIG. 7G, and tested. Referring to FIG. 7H, after one or more operations that result in the cross-section of the die assembly shown in FIG. 7G, the die assembly is flipped.

Figure 7I:
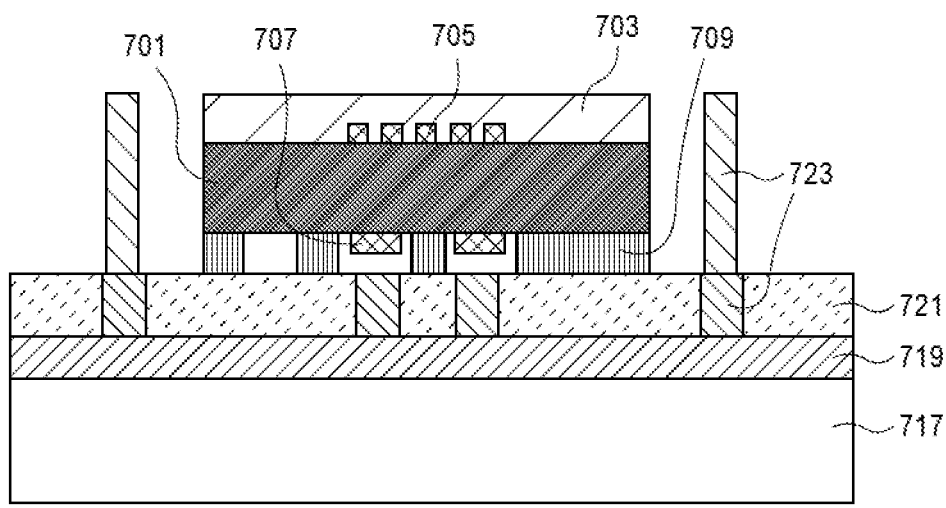

Referring to FIG. 7I, subsequent to one or more operations that result in the cross-section of the die assembly shown in FIG. 7H, the die assembly (if determined to be suitably operating) is attached to a package substrate. In an embodiment, the package substrate includes substrate 717, metal layers 719, dielectric layer 721 and interconnects 723.

Figure 7J:
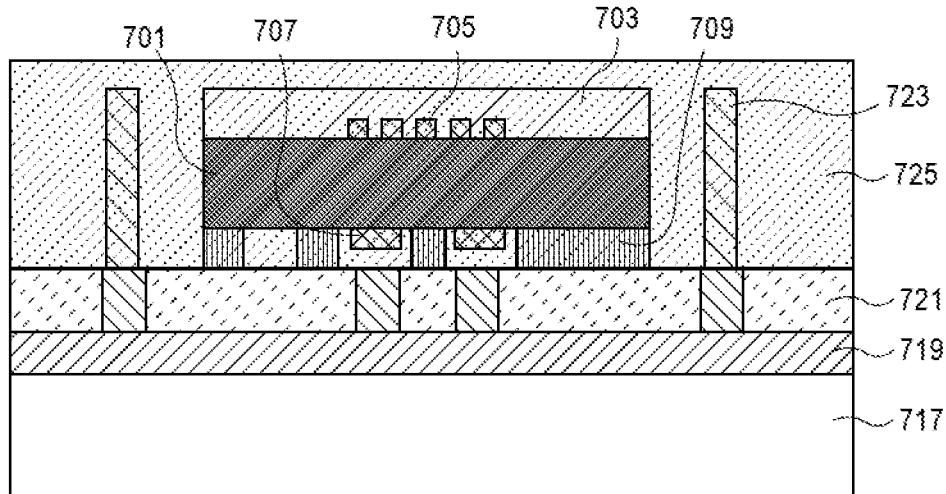
Figure 7K:
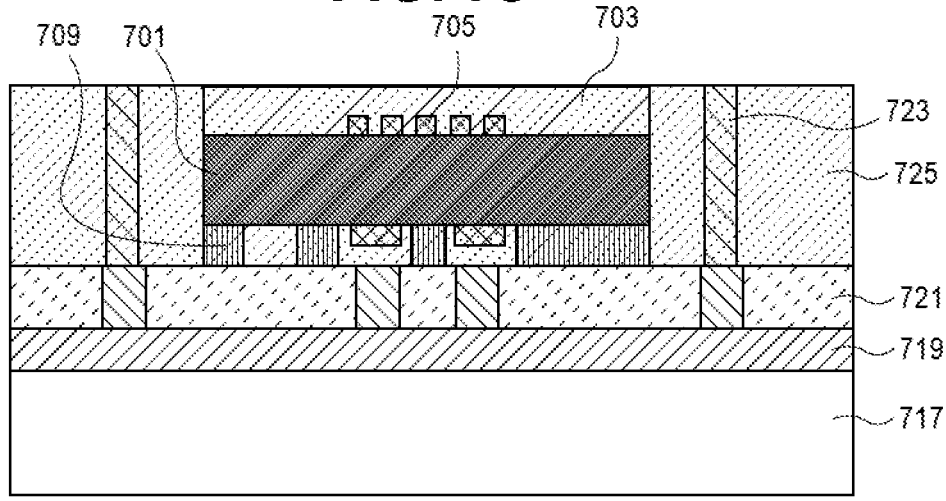

Referring to FIG. 7J, subsequent to one or more operations that result in the cross-section of the package structure shown in FIG. 7I (after die assembly mount), epoxy/mold 725 is used to encapsulate the die assembly and to under-fill the DAF openings. Referring to FIG. 7K, after one or more operations that result in the cross-section of the package structure shown in FIG. 7J, the mold 725 is planarized.

In an embodiment, the mask etching patterned DAF process as described with reference to FIGS. 7A-7K, starts at the wafer level. For example, after the DAF is laminated on die, it is etched through a hard mask to create the desired patterning on DAF. After the DAF has been patterned, the process flow is the same as previous lithography patterned DAF process. In an embodiment, the DAF can be covered with a protective film during mask etching that can remain until die mount in order to protect the DAF.

FIGS. 8A-8L illustrate cross-sections of a package structure during a process of forming the package structure according to an embodiment. FIGS. 8A-8L are cross-sections of the package structure during a process for forming the package structure that includes a patterning of DAF on a package substrate according to an embodiment.

Figure 8A:
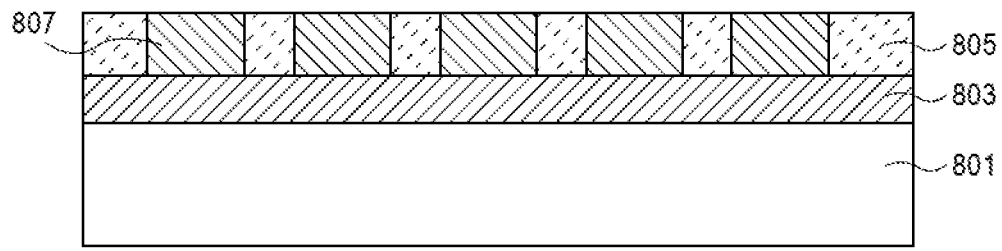
FIGS. 8A-8L illustrate cross-sections of a die assembly and a package substrate during a process of forming a package structure that includes a substrate patterned DAF according to an embodiment.

Referring to FIG. 8A, subsequent to one or more operations a package substrate structure is formed that includes substrate 801, metal layer 803, dielectric layer 805 and interconnects 807.

Figure 8B:
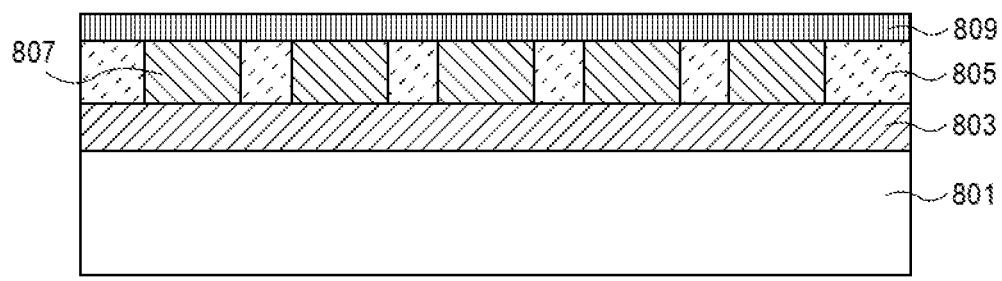

Referring to FIG. 8B, subsequent to one or more operations that result in the cross-section of the package substrate structure shown in FIG. 8A, a DAF lamination is performed. In an embodiment, DAF material 809 is formed on the surface of the die structure. In an embodiment, the surface is formed by the dielectric layer 805 and the interconnects 807.

Figure 8C:
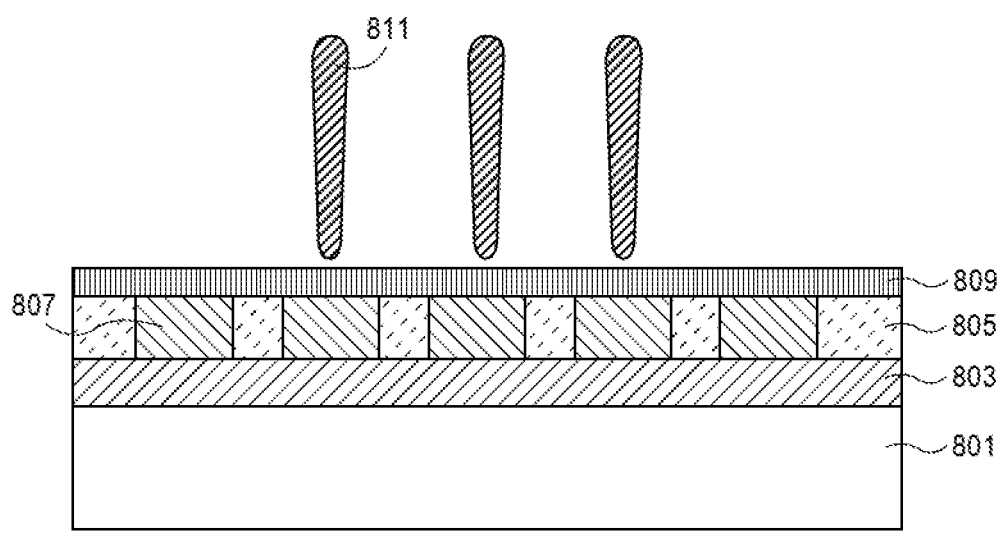
Figure 8D:
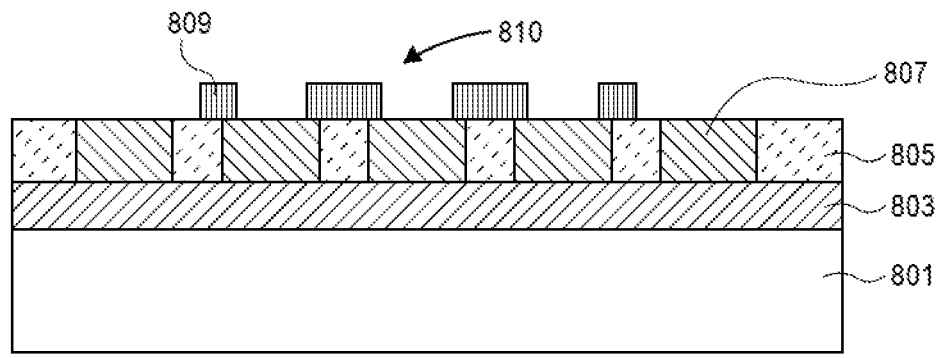

Referring to FIG. 8C, subsequent to one or more operations that result in the cross-section of the package substrate structure shown in FIG. 8B, the DAF material 809 is patterned. In the FIG. 8C embodiment, the DAF material 809 is patterned by laser patterning performed using a laser 811. Referring to FIG. 8D, after one or more operations that result in the cross-section of the package substrate structure shown in FIG. 8C, the desired DAF pattern 810 is formed.

Figure 8E:
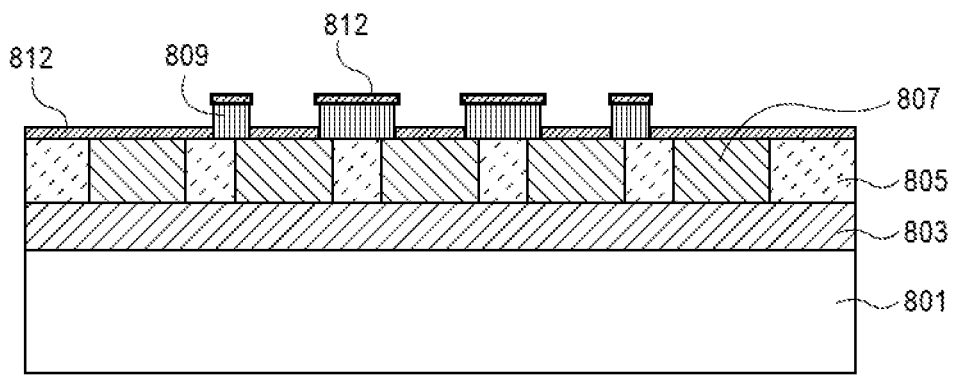

Referring to FIG. 8E, subsequent to one or more operations that result in the cross-section of the package substrate structure shown in FIG. 8D, a seed layer 812 is formed on the surface of the package substrate structure. In particular, the seed layer 812 is formed on the surface of the remaining DAF material 809 and other exposed surfaces of the package substrate structure.

Figure 8F:
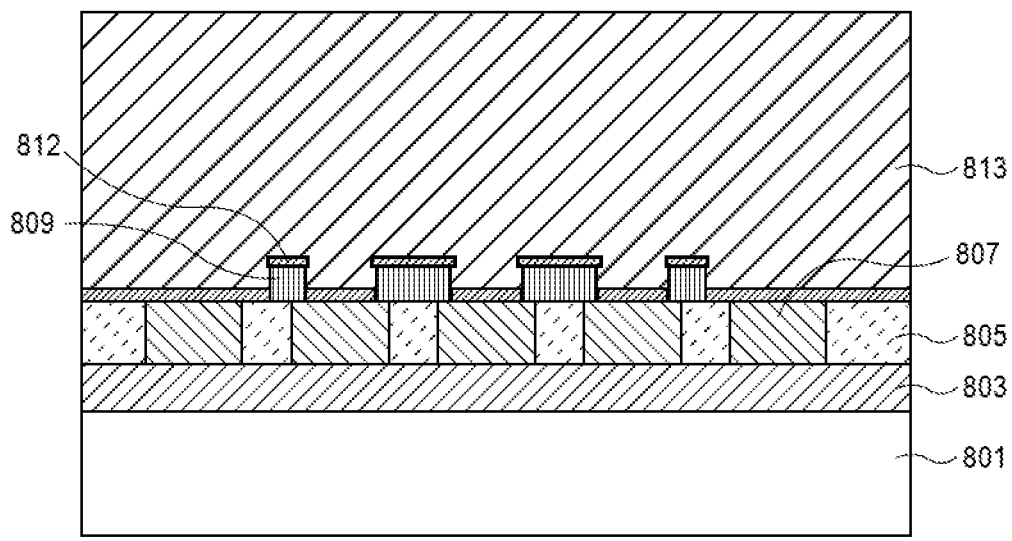

Referring to FIG. 8F, subsequent to one or more operations that result in the cross-section of the package substrate structure shown in FIG. 8E, lamination material 813 is formed to cover/encapsulate the surface of the package substrate structure. In an embodiment, as part of the encapsulation, the surface of the package substrate structure and exposed structures thereon are covered with the lamination material 813.

Figure 8G:
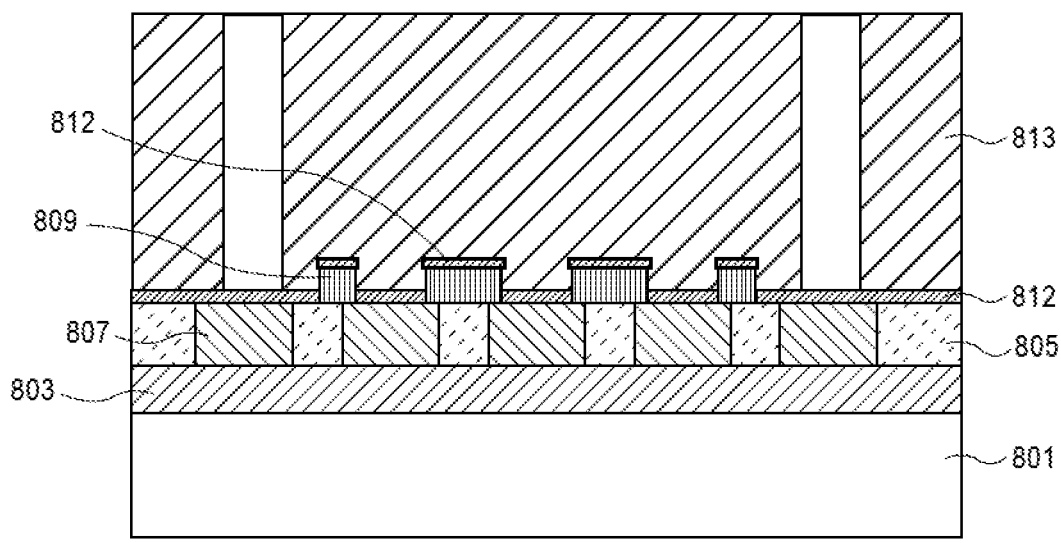
Figure 8H:
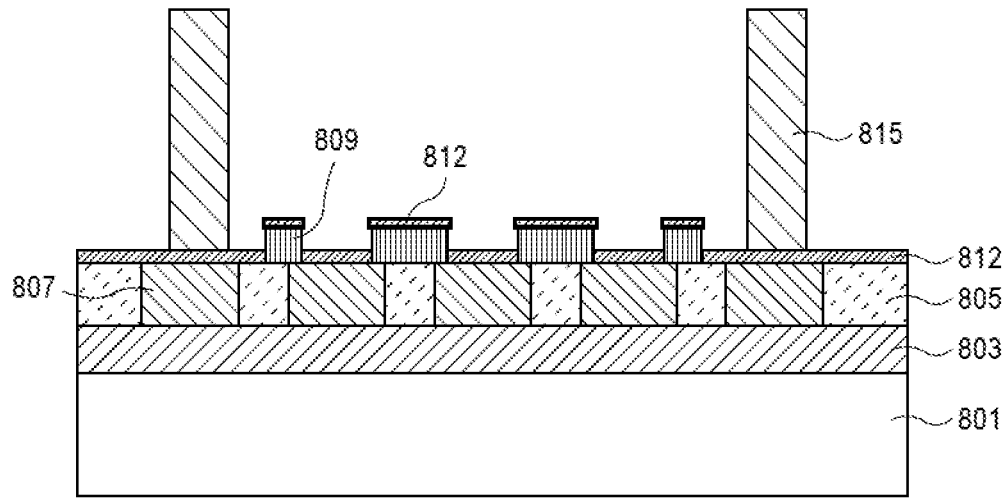

Referring to FIG. 8G, subsequent to one or more operations that result in the cross-section of the package substrate structure shown in FIG. 8F, the lamination material 813 is patterned. In an embodiment, the lamination material 813 is patterned in order to form conductive pillars for electrical connection. Referring to FIG. 8H, after one or more operations that result in the cross-section of the package substrate structure shown in FIG. 8G, the conductive pillars 815 are formed.

Figure 8I:
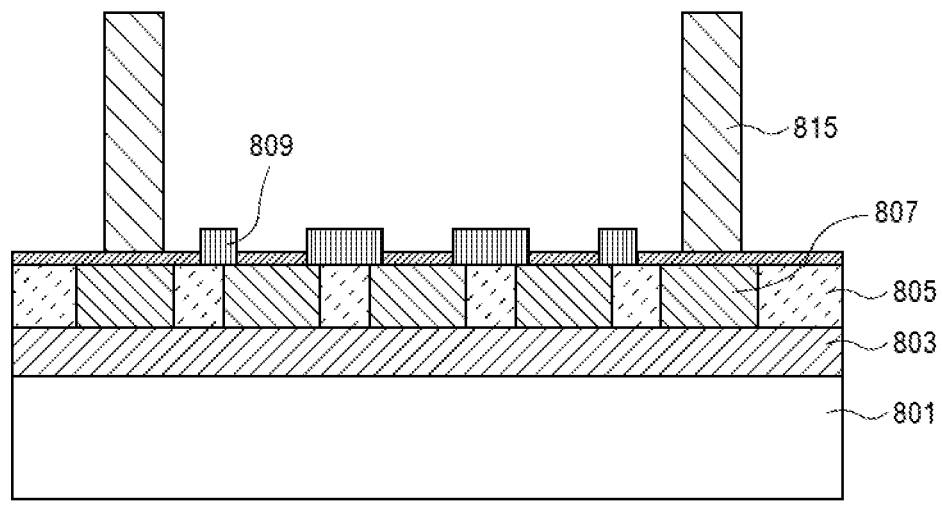
Figure 8J:
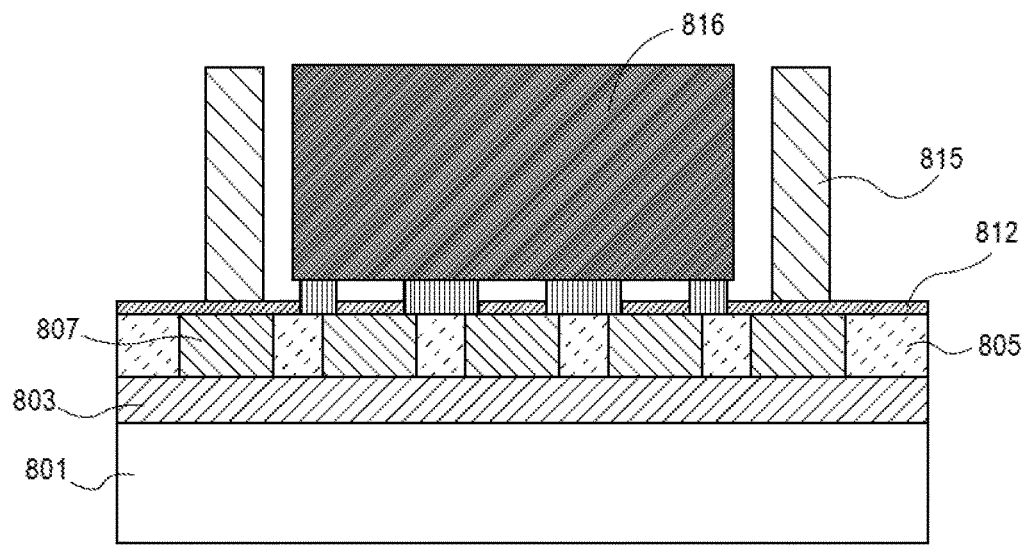

Referring to FIG. 8I, subsequent to one or more operations that result in the cross-section of the structure shown in FIG. 8H, portions of the seed layer 812 above remaining DAF material 809 is removed. Referring to FIG. 8J, after one or more operations that result in the cross-section of the structure shown in FIG. 8I, a die assembly 816 is mounted.

Figure 8K:
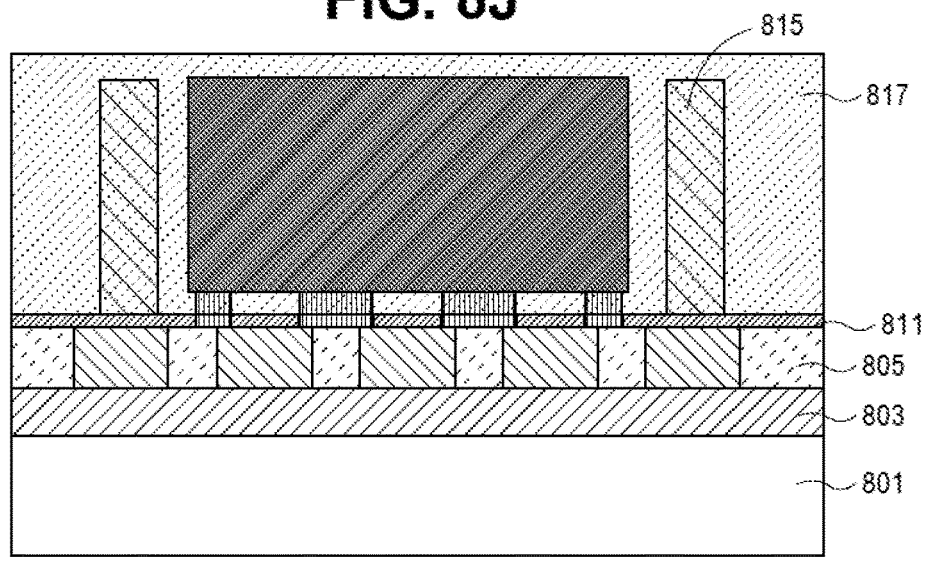
Figure 8L:
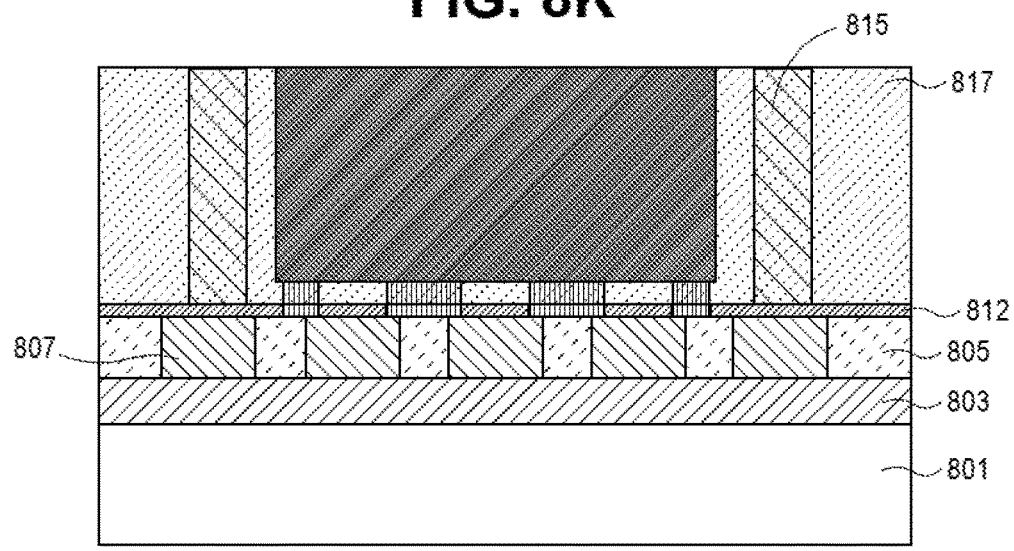

Referring to FIG. 8K, subsequent to one or more operations that result in the cross-section of the structure shown in FIG. 8J, an epoxy/mold 817 is used to encapsulate the die assembly and also under fill DAF openings. Referring to FIG. 8L, after one or more operations that result in the cross-section of the structure shown in FIG. 8K, the mold 817 is planarized.

In an embodiment, in the DAF first and patterned DAF on substrate process described with reference to FIGS. 8A-8L, instead of patterning the DAF on the die, patterning is done directly on the substrate, as part of the DAF first process flow. Using this approach, the DAF is laminated on a substrate that is fabricated separately from the die. Laser drilling or mask etching can be used to pattern the DAF on the substrate. Thereafter, a seed layer can be deposited and a dry film resist (DFR) used to cover the DAF in the die area during pillar plating. The DFR and the seed layer are removed and a normal die mount process can follow. The patterned DAF is filled in while the die is encapsulated, and a planarization is performed to reveal pillars and silicon interconnect bumps.

In an embodiment, the patterned DAF enables an epoxy/mold fill under the die. In conventional flush DAF approaches, no epoxy/mold fill can be formed under the die. In an embodiment, the mixed DAF and epoxy/mold fill under the die can decrease CTE issues.

Figure 9:
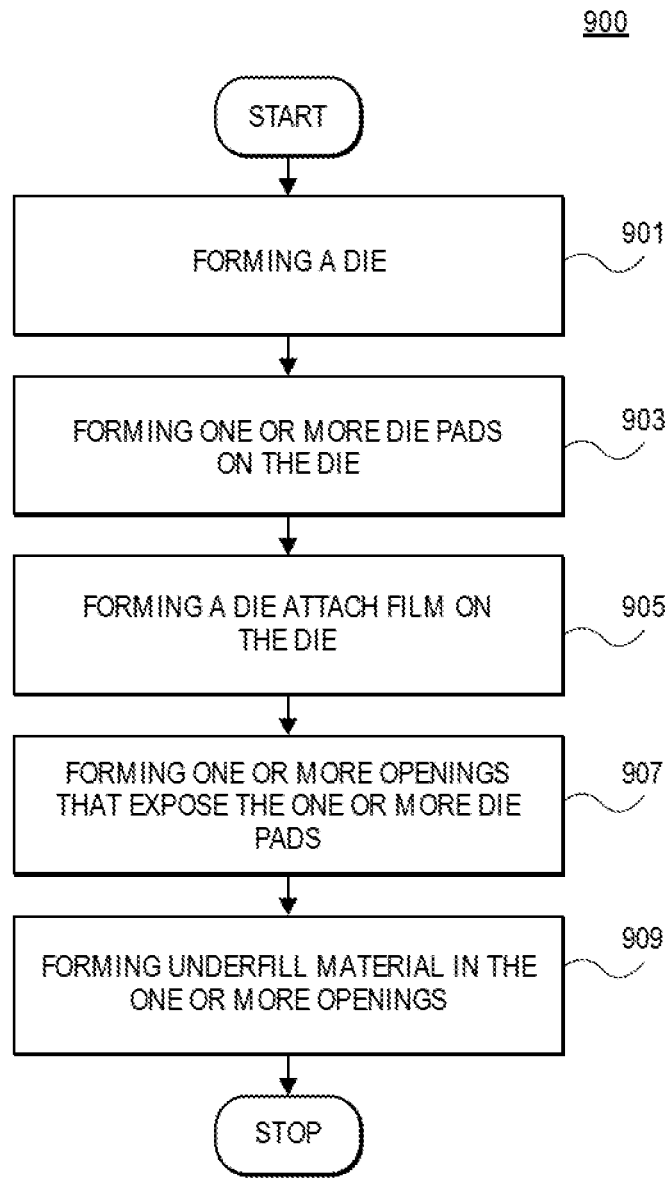
FIG. 9 illustrates a flowchart of a method for patterning die attach film on a die according to an embodiment.

FIG. 9 shows a flowchart of a method for patterning die attach film according to an embodiment. The method for patterning die attach films includes, at 901, forming a die.

At, 903, forming one or more die pads on a first surface of the die. At 905, forming a die attach film on the die. At 907, forming one or more openings that expose the one or more die pads and that extend to one or more edges of the die. At 909, forming underfill material in the one or more openings. In an embodiment, the forming of the one or more openings is performed by lithography patterning, laser patterning or mask etch patterning. In an embodiment, the forming of the one or more openings includes forming one or more channels and filling the one or more channels with underfill material. In an embodiment, the forming of the one or more openings includes forming one or more channels and filling the one or more channels with underfill material that is different from the die attach film material.

Figure 10:
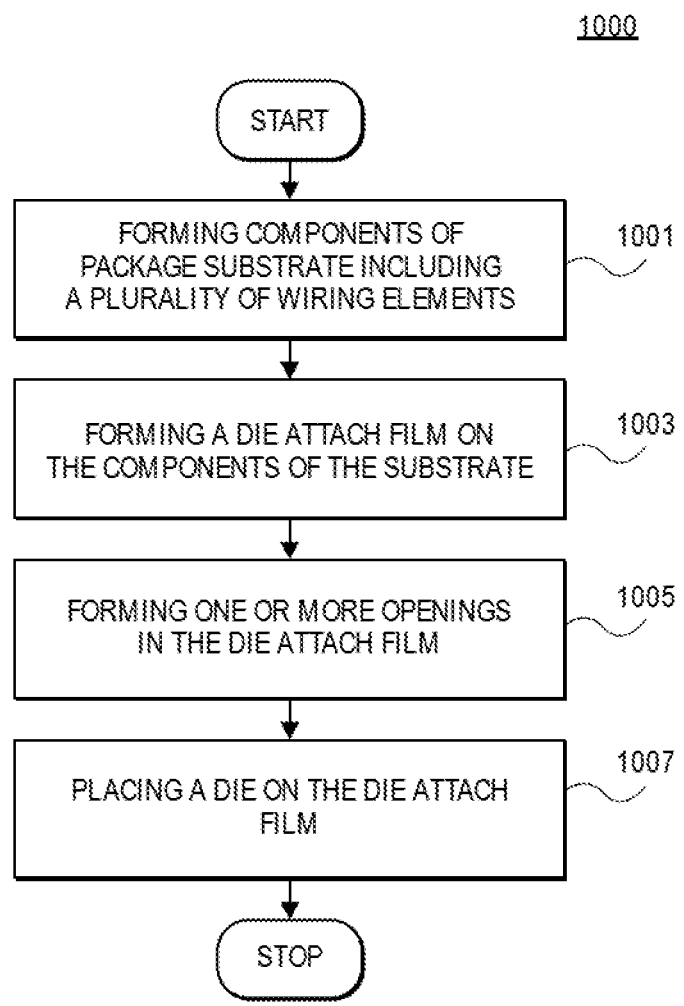
FIG. 10 illustrates a flowchart of a method for patterning die attach film on a substrate and attaching a die according to an embodiment.

FIG. 10 shows a flowchart 1000 of a method for patterning die attach film according to an embodiment. The method includes at 1001, forming components of a package substrate that include a plurality of wiring elements. At 1003, forming a die attach film on the components of the package substrate. At 1005, forming one or more openings in the die attach film. At 1007, placing a die on the die attach film where one or more die pads of the die extend through the one or more openings and contact one or more of the plurality of wiring elements.

Figure 11:
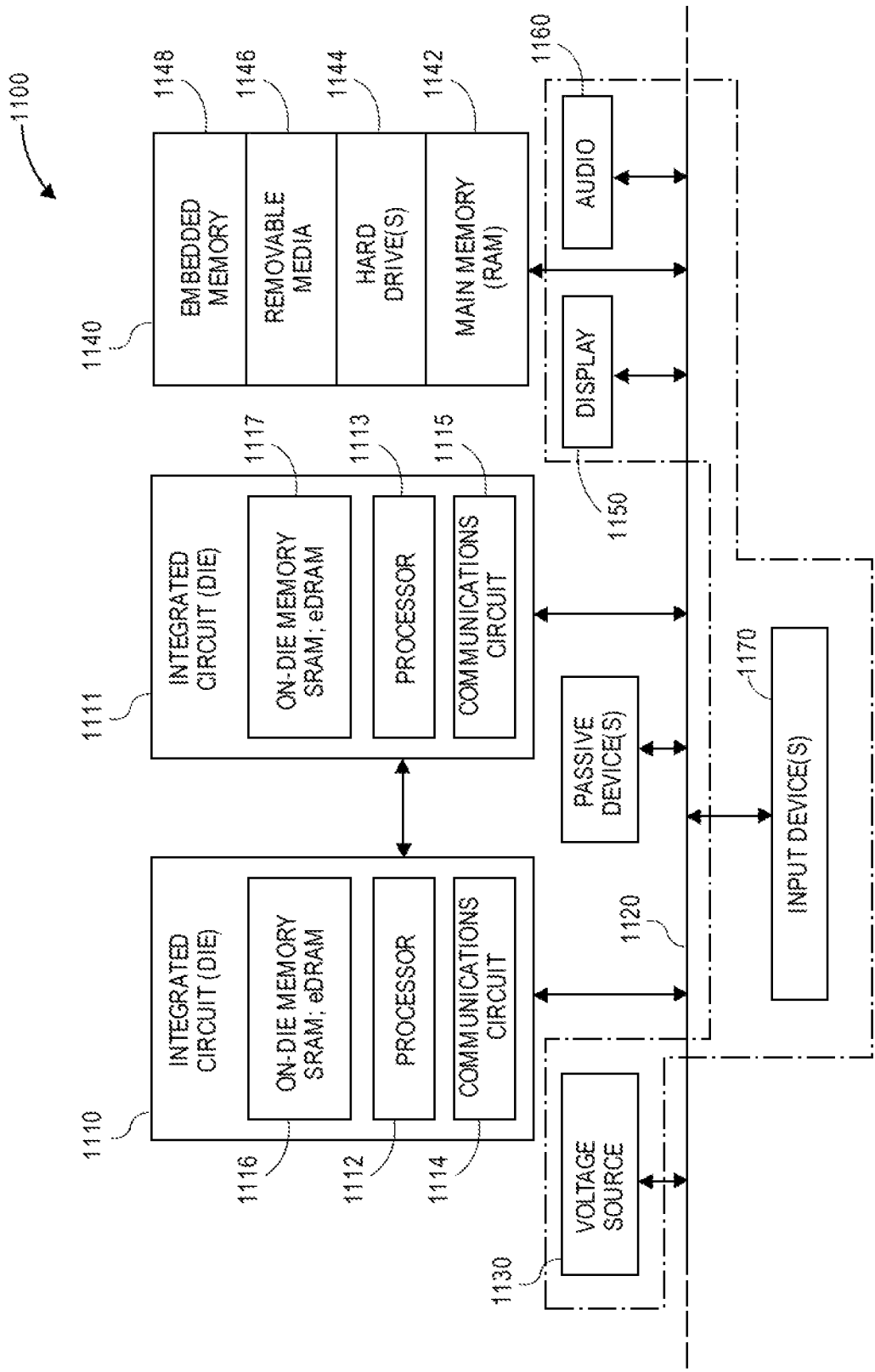
FIG. 11 illustrates a computer system in accordance with an implementation of an embodiment.

FIG. 11 is a schematic of a computer system 1100, in accordance with an embodiment of the present invention. The computer system 1100 (also referred to as the electronic system 1100) as depicted can embody a die assembly (e.g., 400 in FIG. 4A) that includes a patterned DAF layer, according to any of the several disclosed embodiments and their equivalents as set forth in this disclosure. The computer system 1100 may be a mobile device such as a netbook computer. The computer system 1100 may be a mobile device such as a wireless smart phone. The computer system 1100 may be a desktop computer. The computer system 1100 may be a hand-held reader. The computer system 1100 may be a server system. The computer system 1100 may be a supercomputer or high-performance computing system.

In an embodiment, the electronic system 1100 is a computer system that includes a system bus 1120 to electrically couple the various components of the electronic system 1100. The system bus 1120 is a single bus or any combination of busses according to various embodiments. The electronic system 1100 includes a voltage source 1130 that provides power to the integrated circuit 1110. In some embodiments, the voltage source 1130 supplies current to the integrated circuit 1110 through the system bus 1120.

The integrated circuit 1110 is electrically coupled to the system bus 1120 and includes any circuit, or combination of circuits according to an embodiment. In an embodiment, the integrated circuit 1110 includes a processor 1112 that can be of any type. As used herein, the processor 1112 may mean any type of circuit such as, but not limited to, a microprocessor, a microcontroller, a graphics processor, a digital signal processor, or another processor. In an embodiment, the processor 1112 includes, or is coupled with, a die assembly (e.g., 400 in FIG. 4A), as disclosed herein. In an embodiment, SRAM embodiments are found in memory caches of the processor. Other types of circuits that can be included in the integrated circuit 1110 are a custom circuit or an application-specific integrated circuit (ASIC), such as a communications circuit 1114 for use in wireless devices such as cellular telephones, smart phones, pagers, portable computers, two-way radios, and similar electronic systems, or a communications circuit for servers. In an embodiment, the integrated circuit 1110 includes on-die memory 1116 such as static random-access memory (SRAM). In an embodiment, the integrated circuit 1110 includes embedded on-die memory 1116 such as embedded dynamic random-access memory (eDRAM).

In an embodiment, the integrated circuit 1110 is complemented with a subsequent integrated circuit 1111. Useful embodiments include a dual processor 1113 and a dual communications circuit 1115 and dual on-die memory 1117 such as SRAM. In an embodiment, the dual integrated circuit 1110 includes embedded on-die memory 1117 such as eDRAM.

In an embodiment, the electronic system 1100 also includes an external memory 1140 that in turn may include one or more memory elements suitable to the particular application, such as a main memory 1142 in the form of RAM, one or more hard drives 1144, and/or one or more drives that handle removable media 1146, such as diskettes, compact disks (CDs), digital variable disks (DVDs), flash memory drives, and other removable media known in the art. The external memory 1140 may also be embedded memory 1148 such as the first die in a die stack, according to an embodiment.

In an embodiment, the electronic system 1100 also includes a display device 1150, an audio output 1160. In an embodiment, the electronic system 1100 includes an input device such as a controller 1170 that may be a keyboard, mouse, trackball, game controller, microphone, voice-recognition device, or any other input device that inputs information into the electronic system 1100. In an embodiment, an input device 1170 is a camera. In an embodiment, an input device 1170 is a digital sound recorder. In an embodiment, an input device 1170 is a camera and a digital sound recorder.

As shown herein, the integrated circuit 1110 can be implemented in a number of different embodiments, including a package substrate having embody a die assembly (e.g., 400 in FIG. 4A), according to any of the several disclosed embodiments and their equivalents, an electronic system, a computer system, one or more methods of fabricating an integrated circuit, and one or more methods of fabricating an electronic assembly that includes a package substrate having a die assembly (e.g., 400 in FIG. 4A), according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having a die assembly (e.g., 400 in FIG. 4A) embodiments and their equivalents. A foundation substrate may be included, as represented by the dashed line of FIG. 11. Passive devices may also be included, as is also depicted in FIG. 11.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein.

Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example Embodiment 1

A die assembly, including a die, one or more die pads attached to a first surface of the die, and a die attach film on the die, wherein the die attach film includes one or more openings that expose the one or more die pads and that extend to one or more edges of the die.

Example Embodiment 2

The die assembly of example embodiment 1, further comprising one or more die pads attached to a second surface of the die.

Example Embodiment 3

The die assembly of example embodiment 1 or 2, wherein the one or more openings include one or more channels that contain an underfill material.

Example Embodiment 4

The die assembly of example embodiment 1, 2, or 3, wherein the one or more openings include one or more channels that contain an underfill material that is different from the die attach film material.

Example Embodiment 5

The die assembly of example embodiment 1, 2, 3, or 4, wherein the one or more die pads are through silicon via (TSV) backside die pads.

Example Embodiment 6

The die assembly of example embodiment 1, 2, 3, 4, or 5 wherein, the die assembly is on a first package substrate and the one or more die pads are connected to an individual die, a first die and a second die, a second package substrate or an interposer.

Example Embodiment 7

The die assembly of example embodiment 1, 2, 3, 4, 5, or 6, wherein the die structure is surrounded by mold.

Example Embodiment 8

A system including one or more data storage components, and one or more integrated circuit die including a die assembly, including, a die mount package, including, one or more wiring layers, one or more dielectric layers, and a die mount space, a die assembly, including, a die in the die mount space, one or more die pads attached to a first surface of the die, and a die attach film on the die, wherein the die attach film includes one or more openings that expose the one or more die pads and that extend to one or more edges of the die.

Example Embodiment 9

The system of example embodiment 8, further comprising one or more die pads attached to a second surface of the die.

Example Embodiment 10

The system of example embodiment 8 or 9, wherein the one or more openings include one or more channels that contain an underfill material.

Example Embodiment 11

The system of example embodiment 8, 9, or 10, wherein the one or more openings include one or more channels that contain an underfill material that is different from the die attach film material.

Example Embodiment 12

The system of example embodiment 8, 9, 10, or 11, wherein the one or more die pads are through silicon via (TSV) backside die pads.

Example Embodiment 13

The system of example embodiment 8, 9, 10, 11, or 12, wherein the die assembly is on a first package substrate and the one or more die pads are connected to an individual die, a first die and a second die, a second package substrate or an interposer.

Example Embodiment 14

The system of example embodiment 8, 9, 10, 11, 12, or 13, wherein the die assembly is surrounded by mold.

Example Embodiment 15

A method including forming a wafer having first and second surfaces, forming die pads on the first and second surfaces, forming lamination that covers the die pads on the first surface of the wafer, flipping the wafer to cause the second surface to face upward, forming a die attach film on the second surface, patterning the die attach film, singulating the wafer to form a die, mounting the die on a substrate, encapsulating the die on the substrate with encapsulating material, and planarizing the encapsulating material.

Example Embodiment 16

The method of example embodiment 15, wherein the patterning includes lithography patterning.

Example Embodiment 17

The method of example embodiment 15 wherein the patterning includes laser patterning.

Example Embodiment 18

The method of example embodiment 15, wherein the patterning includes mask etch patterning.

Example Embodiment 19

A method, including forming a die, forming one or more die pads on a first surface of the die, and forming a die attach film on the die including forming one or more openings that expose the one or more die pads and that extend to one or more edges of the die.

Example Embodiment 20

The method of example embodiment 19, further comprising mounting the die on a die mount package Example Embodiment 21

The method of example embodiment 19 or 20, wherein the forming the one or more openings includes lithography patterning, laser patterning or mask etch patterning.

Example Embodiment 22

The method of example embodiment 19, 20, or 21, wherein the forming one or more openings include forming one or more channels and filling the one or more channels with an underfill material.

Example Embodiment 23

The method of example embodiment 19, 20, 21, or 22, wherein the forming the one or more openings includes forming one or more channels and filling the one or more channels with an underfill material that is different from the die attach film material.

Example Embodiment 24

A method including forming components of a package substrate that include a plurality of wiring elements, forming a die attach film on the components of the package substrate, forming one or more openings in the die attach film, and placing a die above the die attach film, wherein one or more die pads of the die extend through the one or more openings and contact one or more of the plurality of wiring elements.

What is claimed is:

1. A die assembly, comprising:
a die;
one or more die pads on a first surface of the die; and
a die attach film on the first surface of the die but not along sides of the die, wherein the die attach film includes one or more openings that expose the one or more die pads and that extend to one or more edges of the die, the one or more openings exposing sidewalls of the one or more die pads, and wherein the die attach film has an uppermost surface above an uppermost surface of the one or more die pads.

2. The die assembly of claim 1, further comprising one or more die pads attached to a second surface of the die.

3. The die assembly of claim 1, wherein the one or more openings include one or more channels that contain an underfill material.

4. The die assembly of claim 1, wherein the one or more openings include one or more channels that contain an underfill material that is different from the die attach film material.

5. The die assembly of claim 1, wherein the one or more die pads are through silicon via (TSV) backside die pads.

6. The die assembly of claim 1, wherein the die assembly is surrounded by mold.

7. A system, comprising:
one or more storage components; and
one or more integrated circuit die including a die assembly that includes:
a die in a die mount space;
one or more die pads attached to a first surface of the die; and
a die attach film on the first surface of the die but not along sides of the die, wherein the die attach film includes one or more openings that expose the one or more die pads and that extend to one or more edges of the die, the one or more openings exposing sidewalls of the one or more die pads, and wherein the die attach film has an uppermost surface above an uppermost surface of the one or more die pads.

8. The system claim 7, further comprising one or more die pads attached to a second surface of the die.

9. The system of claim 7, wherein the one or more openings include one or more channels that contain an underfill material.

10. The system of claim 7, wherein the one or more openings include one or more channels that contain an underfill material that is different from the die attach film material.

11. The system of claim 7, wherein the one or more die pads are through silicon via (TSV) backside die pads.

12. The system of claim 7, wherein the die assembly is surrounded by mold.

* * * * *